(12) United States Patent
Kitano et al.

(10) Patent No.: US 7,534,467 B2
(45) Date of Patent: May 19, 2009

(54) REDUCED-PRESSURE DRYING UNIT AND COATING FILM FORMING METHOD

(75) Inventors: Takahiro Kitano, Kumamoto (JP); Manabu Hama, Kumamoto (JP); Shinichi Sugimoto, Kumamoto (JP); Naoya Hirakawa, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 799 days.

(21) Appl. No.: 10/932,042

(22) Filed: Sep. 2, 2004

(65) Prior Publication Data
US 2005/0087129 A1    Apr. 28, 2005

Related U.S. Application Data

(62) Division of application No. 10/217,458, filed on Aug. 14, 2002, now Pat. No. 6,808,566.

(30) Foreign Application Priority Data
Sep. 19, 2001    (JP) ............................. 2001-285481

(51) Int. Cl.
*B05D 3/00* (2006.01)
*B05D 3/12* (2006.01)

(52) U.S. Cl. .................. 427/240; 427/350; 118/50; 118/52; 118/58; 438/758

(58) Field of Classification Search ................. 427/240, 427/350; 118/50, 52, 58; 438/758
See application file for complete search history.

(56) References Cited

U.S. PATENT DOCUMENTS

| 4,685,206 | A | * | 8/1987 | Kobayashi et al. ............. 29/740 |
| 5,860,640 | A | * | 1/1999 | Marohl et al. ............ 269/289 R |
| 6,097,005 | A | | 8/2000 | Akimoto |
| 6,190,459 | B1 | | 2/2001 | Takeshita et al. |
| 6,599,366 | B1 | | 7/2003 | Kitano et al. |
| 6,773,510 | B2 | * | 8/2004 | Kitano et al. .................. 118/52 |
| 2001/0003964 | A1 | * | 6/2001 | Kitano et al. .................. 118/50 |

FOREIGN PATENT DOCUMENTS

JP    6018610 A    9/1985

\* cited by examiner

*Primary Examiner*—Kirsten C Jolley
(74) *Attorney, Agent, or Firm*—Oblon, Spivak, McClelland, Maier & Neustadt, P.C.

(57) ABSTRACT

The invention includes a hermetic container provided with a substrate mount; a vacuum exhauster connected to the hermetic container; a current member; and a current member raising and lowering mechanism. When the current member is raised and lowered as a function of the pressure inside the hermetic container, a liquid flow of the coating solution on the substrate is controlled, thereby controlling the uniformity of the film thickness of the coating solution.

1 Claim, 21 Drawing Sheets

REDUCED-PRESSURE DRYING UNIT AND COATING FILM FORMING METHOD

BACKGROUND OF THE INVENTION

1. Field of the Invention

The present invention relates to a reduced-pressure drying unit and a coating film forming method for vaporizing a solvent from a coating solution when the coating solution made by, for example, mixing a component of a coating film in the solvent, for example, a resist solution is applied to a substrate such as a semiconductor wafer or an LCD substrate (a glass substrate for a liquid crystal display) to form the coating film.

2. Description of the Related Art

In fabrication processes of semiconductor devices and LCDs, resist processing is performed for a substrate to be processed by a technique called photolithography. This technique includes a series of steps of applying a resist solution to, for example, a semiconductor wafer (hereinafter, referred to as a wafer) to form a solution film on its front face, exposing the resist film to light using a photomask, and thereafter performing a developing treatment to obtain a desired pattern.

There is one method for the above-described coating treatment of the resist solution, in which, for example, as shown in FIG. 30, a coating solution is applied in a manner of so-called drawing with one stroke such that the coating solution (the resist solution) made by mixing a resist that is a component of a coating film and a solvent is discharged onto a wafer front face from a nozzle 10 while the nozzle 10 provided above the wafer W is being reciprocated in an X-direction and the wafer W is intermittently moved in a Y-direction. Numeral 12 in FIG. 30 denotes a mask which covers a region other than a circuit formation region 11 of the wafer.

For carrying out the above-described method, it is considered to be preferable that the wafer is carried into a reduced-pressure drying unit for reduced-pressure drying immediately after the coating solution is applied onto the wafer because a solvent having a low vaporization is used as the solvent contained in the coating solution and the uniformity of the film thickness of the coating film is secured by quickly removing the solvent from the front face of the wafer.

FIG. 31 is a view showing a conventional reduced-pressure drying unit in which numeral 13 denotes a hermetic container constituted by a lid body 14 and a mount 15, and a ceiling portion of the lid body 14 is formed with an opening 14a. The opening 14a can communicate with a vacuum pump 16 through an exhaust pipe 14b to reduce the pressure in the hermetic container 13. In such a unit, the wafer W is mounted on the mount 15 and heated by a not shown heater, and the vacuum pump 16 is actuated to reduce the pressure in the hermetic container 13, thereby causing the solvent, for example, a thinner or the like remaining on the front face of the wafer W to vaporize (dry) and the vaporized solvent to be sucked toward the vacuum pump 16 side, so that the resist component in the coating solution remains on the front face of the wafer W.

Meanwhile, a coating solution 17 on the front face of the wafer, when carried into the reduced-pressure drying unit, is rounded, for example, as shown in FIG. 32, at a peripheral region of the wafer (a region inside by a predetermined distance, for example, about 20 mm from the periphery) due to a surface tension of the coasting solution itself. Therefore, it is considered to provide a current plate 18 above the wafer W mounted on the mount 15 in such a manner that the current plate 18 faces the wafer W as shown by a dotted line in FIG. 31. When the current plate 18 is provided as described above and the pressure in the hermetic container 13 is reduced, an air current is formed which spreads outward between the current plate 18 and the wafer W to cause the coating solution to spread toward the periphery on the front face of the wafer.

Therefore, if the current plate 18 is provided and reduced-pressure drying processing is performed, the coating solution is drawn toward the periphery as shown in FIG. 33, resulting in an extremely large thickness of the coating film at the peripheral region. The coating film with a rounded shape or an accumulated portion at the peripheral region as described above cannot be used as a circuit formation region because the peripheral region of the coating film is greatly different in film thickness from the center region. Hence, there is a request that the circuit formation region occupies an area as large as possible to improve the yield of chips per wafer, and thus a significant problem is a control of the film thicknesses at the center region and the peripheral region in the coating film formed on the front face of the wafer.

SUMMARY OF THE INVENTION

The present invention is made due to such circumstances, and it is an object of the present invention to provide a technique capable of securing a high in-plane uniformity of film thickness by controlling the film thickness of a coating film during reduced-pressure drying in a reduced-pressure drying unit for a substrate provided, for example, in a coating film forming apparatus.

In order to attain the above object, according to a first aspect of the present invention, a reduced-pressure drying unit of the present invention comprises: a hermetic container provided therein with a mount for mounting thereon a substrate coated with a coating solution made by mixing a component of a coating film and a solvent; a vacuum exhauster connected to the hermetic container through an exhaust passage for reducing a pressure in the hermetic container to vaporize the solvent from the coating solution on the substrate; a current member provided to face a front face of the substrate mounted on the mount; and a current member raising and lowering mechanism for raising and lowering the current member, wherein the current member is raised and lowered by the current member raising and lowering mechanism to change in height position while the pressure inside the hermetic container is reduced to vaporize the solvent from the coating solution on the substrate.

According to another aspect, a reduced-pressure drying unit of the present invention comprises: a hermetic container provided therein with a mount for mounting thereon a substrate coated with a coating solution made by mixing a component of a coating film and a solvent; a heater provided in the mount for heating the substrate; a vacuum exhauster connected to the hermetic container through an exhaust passage for reducing a pressure in the hermetic container to vaporize the solvent from the coating solution on the substrate; and an annular member made of a material having a heat conductivity different from that of the mount, provided on the mount and coming into contact with a peripheral region of a rear face of the substrate.

According to still another aspect, a reduced-pressure drying unit of the present invention comprises: a hermetic container provided therein with a mount for mounting thereon a substrate coated with a coating solution made by mixing a component of a coating film and a solvent; a vacuum exhauster connected to the hermetic container through an exhaust passage for reducing a pressure in the hermetic container to vaporize the solvent from the coating solution on the substrate; and a plurality of aligning members provided at positions outside the mount and apart from a center position of the mount by equal distances in radial directions, wherein the plurality of aligning members synchronously move in substantially horizontal directions from the positions outside the substrate to positions to come into contact with an edge of the substrate to align the center position of the mount and a center position of the substrate.

According to yet another aspect, a reduced-pressure drying unit of the present invention comprises: a hermetic container provided therein with a mount for mounting thereon a substrate coated with a coating solution made by mixing a component of a coating film and a solvent; a vacuum exhauster connected to the hermetic container through an exhaust passage for reducing a pressure in the hermetic container to vaporize the solvent from the coating solution on the substrate; a supporting member provided at the mount for supporting the substrate while slightly lifting the substrate from a front face of the mount; and a ventilation passage formed in the mount and communicating with an outside of the hermetic container.

According to still another aspect, the present invention is a method for forming a coating film on a substrate which comprises: a step of applying to a front face of the substrate a coating solution made by mixing a component of a coating film and a solvent; a step of mounting the substrate coated with the coating solution in a hermetic container; a reduced-pressure drying step of reducing a pressure in the hermetic container by exhausting an air therein by a vacuum exhauster to vaporize the solvent in the coating solution applied on the substrate; a first step, performed in the reduced-pressure drying step, of positioning a current member so that the current member faces the substrate at a first position above the substrate mounted in the hermetic container; and a second step, performed in the reduced-pressure drying step and after the first step, of moving the current member so that the current member faces the substrate at a second position different from the first position.

According to still another aspect, the present invention is a method for forming a coating film on a substrate which comprises: a step of applying to a front face of the substrate a coating solution made by mixing a component of a coating film and a solvent; a step of mounting the substrate coated with the coating solution on a top face of a mount in a hermetic container; subsequently, a step of aligning center positions of the substrate and the mount by an aligning member; and a reduced-pressure drying step of reducing a pressure in the hermetic container by exhausting an air therein by a vacuum exhauster to vaporize the solvent in the coating solution applied on the substrate.

According to the present invention, an exhaust current flowing outward from the center is formed between the current member and the substrate during the reduced-pressure drying processing, but the liquid flow of the coating solution on the substrate is controlled by changing the height position of the current member in the reduced-pressure drying processing, thereby controlling the film thickness of the coating film on the front face of the substrate. This prevents a rounded shape or an accumulated portion of the coating solution at a peripheral region of the substrate, so that the film thicknesses of the coating solution are made uniform between the center region and the peripheral region, resulting in improved uniformity of film thickness.

Further, according to the present invention, the substrate is heated by the heater provided in the mount, but the peripheral region of the substrate is in contact with the annular member which has a heat conductivity different from that of the mount, thereby causing different temperatures and accordingly different vaporization rates of the solvent contained in the coating solution between the center region and the peripheral region of the substrate. Consequently, it is possible to control the film thickness of the coating film on the front face of the substrate, so that the film thicknesses of the coating solution are made uniform between the center region and the peripheral region, resulting in improved uniformity of film thickness.

Further, according to the present invention, the substrate can be mounted on the mount with the center of the mount and the center of the substrate aligned with each other, so that uniform reduced-pressure drying processing can be performed.

Furthermore, according to the present invention, when the hermetic container is returned from the reduced-pressure atmosphere to the atmospheric pressure, the reduced-pressure state is quickly released also on the rear face side of the substrate mounted on the mount because of air leakage from the ventilation passage, thereby preventing the center portion of the rear face side of the substrate from being sucked to the mount for prevention of warpage of the substrate.

DETAILED DESCRIPTION OF THE PREFERRED EMBODIMENTS

Figure 1:
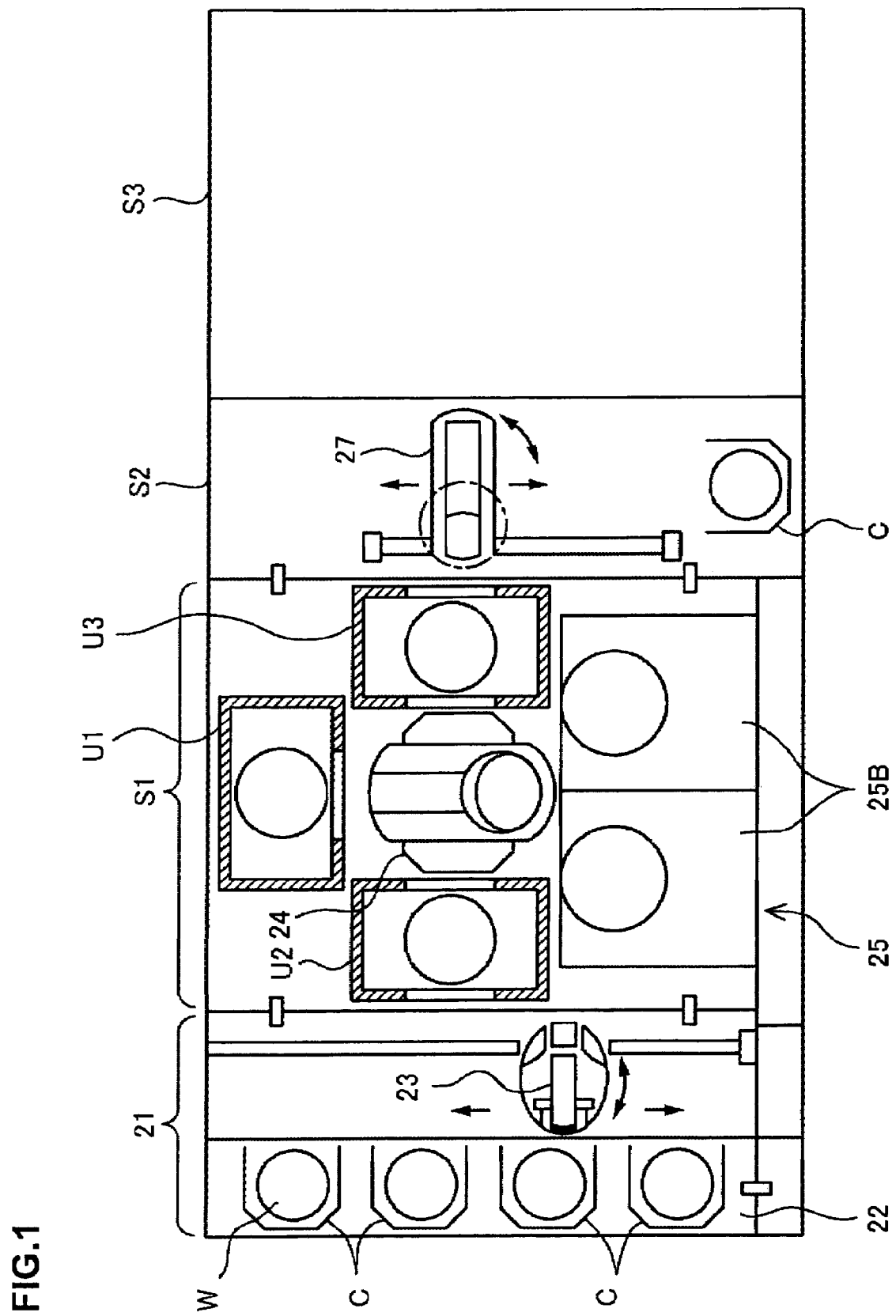
FIG. 1 is a plane view showing a whole structure, in an embodiment, of a coating film forming apparatus in which a reduced-pressure drying unit according to the present invention is installed.
Figure 2:
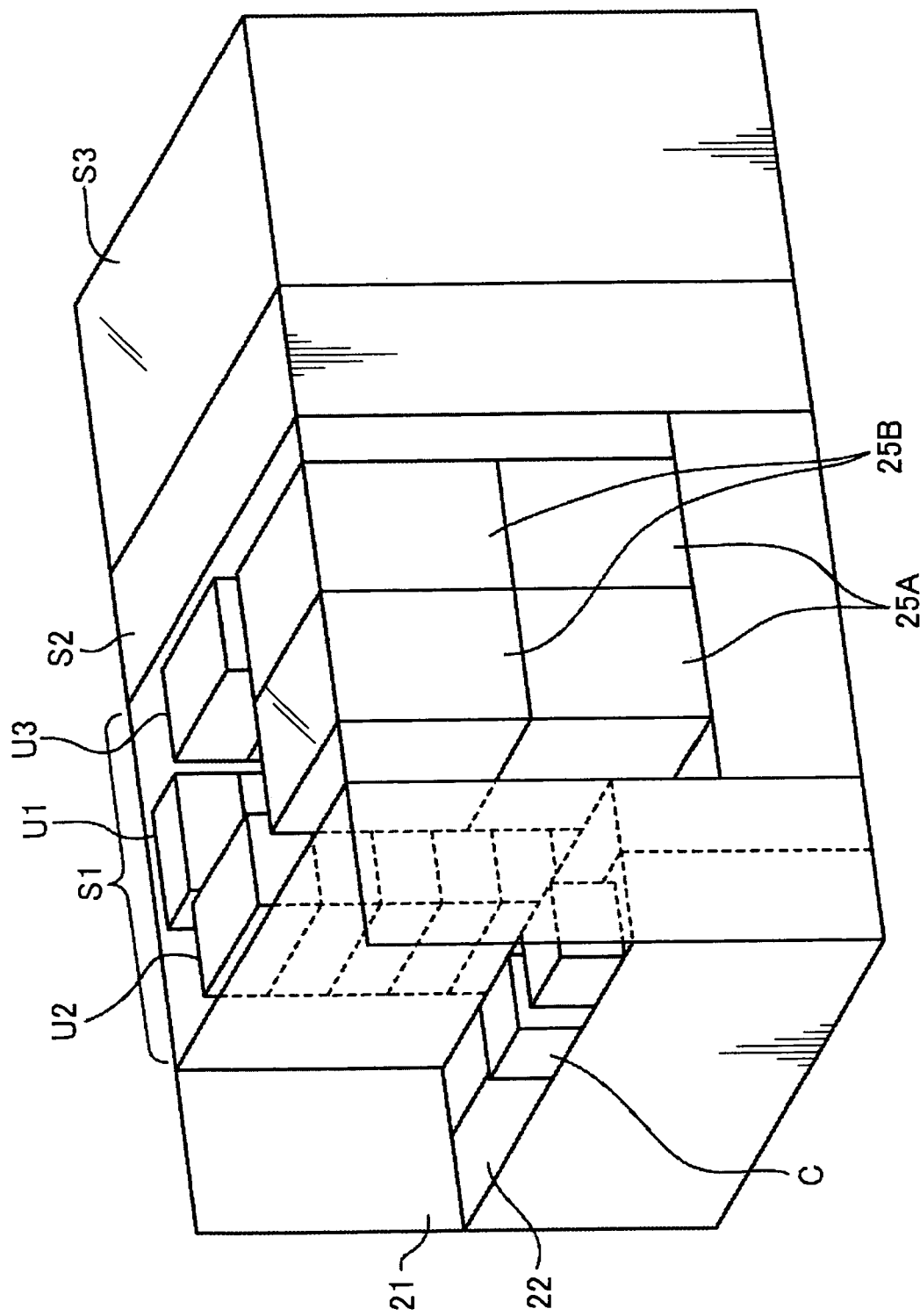
FIG. 2 is a perspective view showing the whole structure in the above embodiment.
Figure 3:
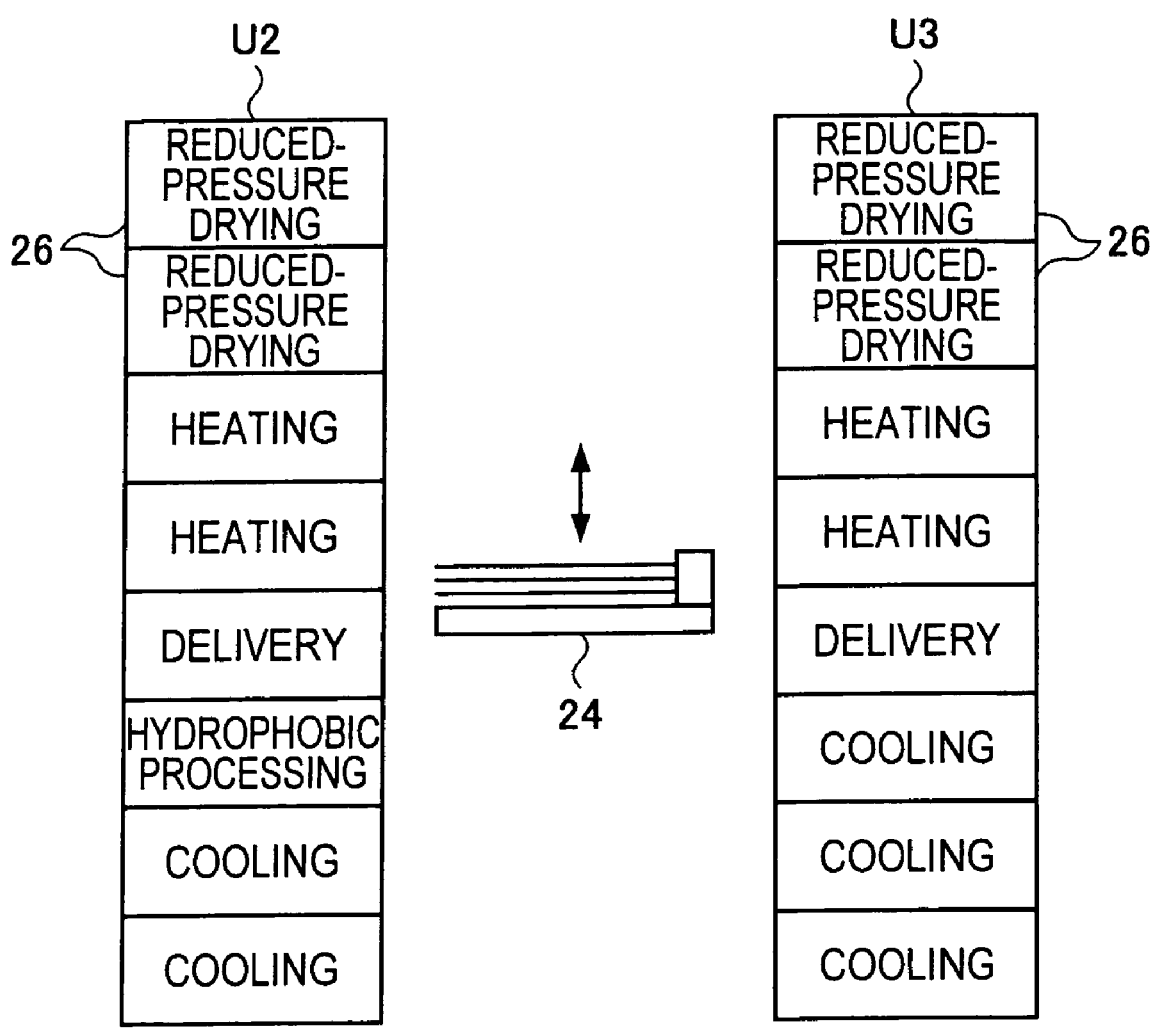
FIG. 3 is a schematic cross-sectional view showing a configuration of a shelf unit used in the above embodiment.

First of all, an entire configuration of a coating film forming apparatus in which a reduced-pressure drying unit according to the present invention is installed will be briefly explained below with reference to FIG. 1 to FIG. 3. In the drawings, numeral 21 denotes a cassette station, in which a cassette mounting section 22 for mounting thereon cassettes C in which, for example, 25 wafers W are housed and a delivery arm 23 for delivering and receiving the wafers W to/from the mounted cassette C are provided. A processing section S1 is connected to the back side of the delivery arm 23. A main carrier 24 is provided in the center part of the processing section S1 and, in such a manner to surround the main carrier 24, a coating and developing system unit 25 including a plurality of coating units 25A and developing units 25B is disposed, for example, on the right-hand side as seen to the back side and shelf units U1, U2, and U3 including heating and cooling system units and the like multi-tiered are disposed on the left-hand side, the front side, and the back side respectively.

The shelf units U1, U2, and U3 are constituted by combining various type of units for performing pre-process and post-process of the coating units 25A. This combination includes, for example, a reduced-pressure drying unit 26 which dries, in a reduced pressure atmosphere, the wafer W coated with a coating solution on the front face in the coating unit 25A to vaporize a solvent contained in the coating solution, a heating unit for heating (baking) the wafer W, a cooling unit for cooling the wafer W, a hydrophobic processing unit, and the like as typified by the shelf units U2 and U3, for example, shown in FIG. 3. It should be noted that a delivery unit including a delivery table for delivering and receiving the wafer W is also installed in each of the shelf units U2 and U3. Further, the above-described main carrier 24 is configured, for example, to be freely ascendable and descendable, movable forward and backward, and rotatable about the vertical axis so as to be capable of delivering and receiving the wafer W to/from the coating units 25A, the developing units 25B, and each unit constituting the shelf units U1, U2, and U3.

To the back side of such a processing section S1, an aligner S3 is connected via an interface section S2. The interface section S2 delivers the wafer W between the processing section S1 and the aligner S3 by a carrier arm 27 which is configured, for example, to be freely ascendable and descendable, movable leftward and rightward and forward and backward, and rotatable about the vertical axis.

The flow of the wafer W in such a coating film forming apparatus is briefly explained. First of all, when a cassette C is carried into the cassette station 21, a wafer W is taken out by the delivery arm 23. Then, the wafer W is delivered from the delivery arm 23 via the delivery unit in the shelf unit U2 to the main carrier 24. The wafer W is subjected to hydrophobic processing in the hydrophobic processing unit and thereafter carried into the coating unit 25A, where the wafer W is coated with a resist solution that is the coating solution.

Subsequently, the wafer W coated with the coating solution is carried by the main carrier 24 to the reduced-pressure drying unit 26, where the solvent contained in the coating solution on the front face of the wafer W is vaporized to dry by a predetermined method. The wafer W after the processing passes through steps in a reverse order to that when carried into the reduced-pressure drying unit 26, is carried out by the main carrier 24, and is carried to the cooling unit in which the next step is performed. Thereafter, the wafer W is carried via the interface section S2 and the carrier arm 27 to the aligner S3, where the wafer W is exposed to light via a mask corresponding to a pattern. The wafer after the exposure is carried to the processing section S1 through a reverse route, and carried via the cooling unit to the developing unit 25B and subjected to a developing treatment to be formed with a resist mask. Thereafter, the wafer W is returned to the original cassette C through a reverse route.

Figure 4:
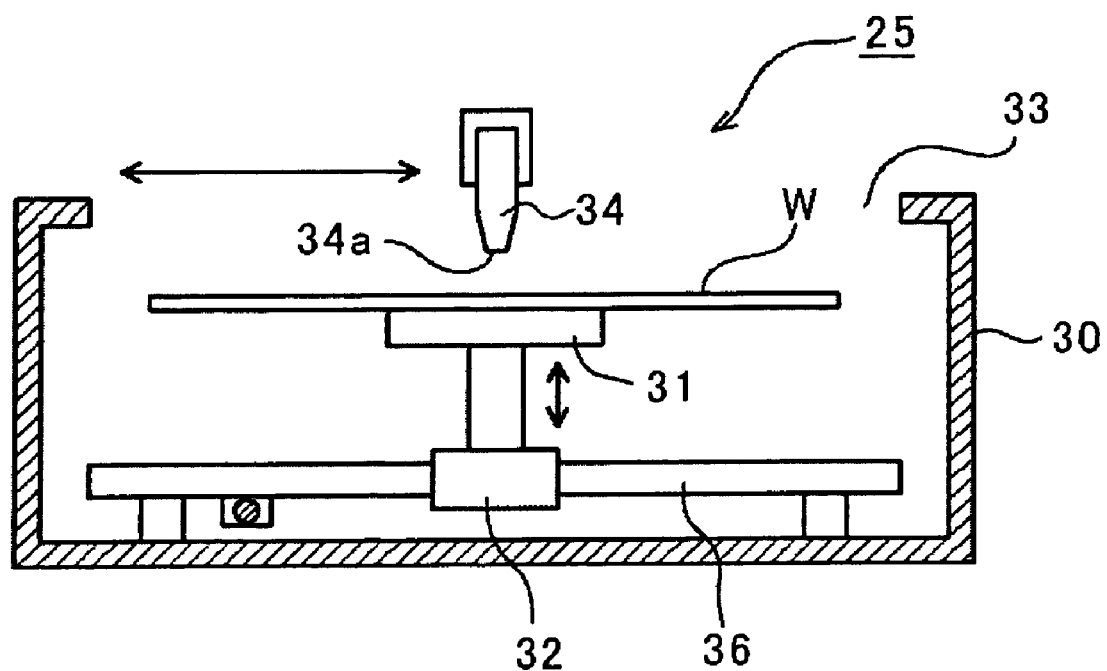
FIG. 4 is a vertical cross-sectional view for explaining a coating unit used in the above embodiment.
Figure 5:
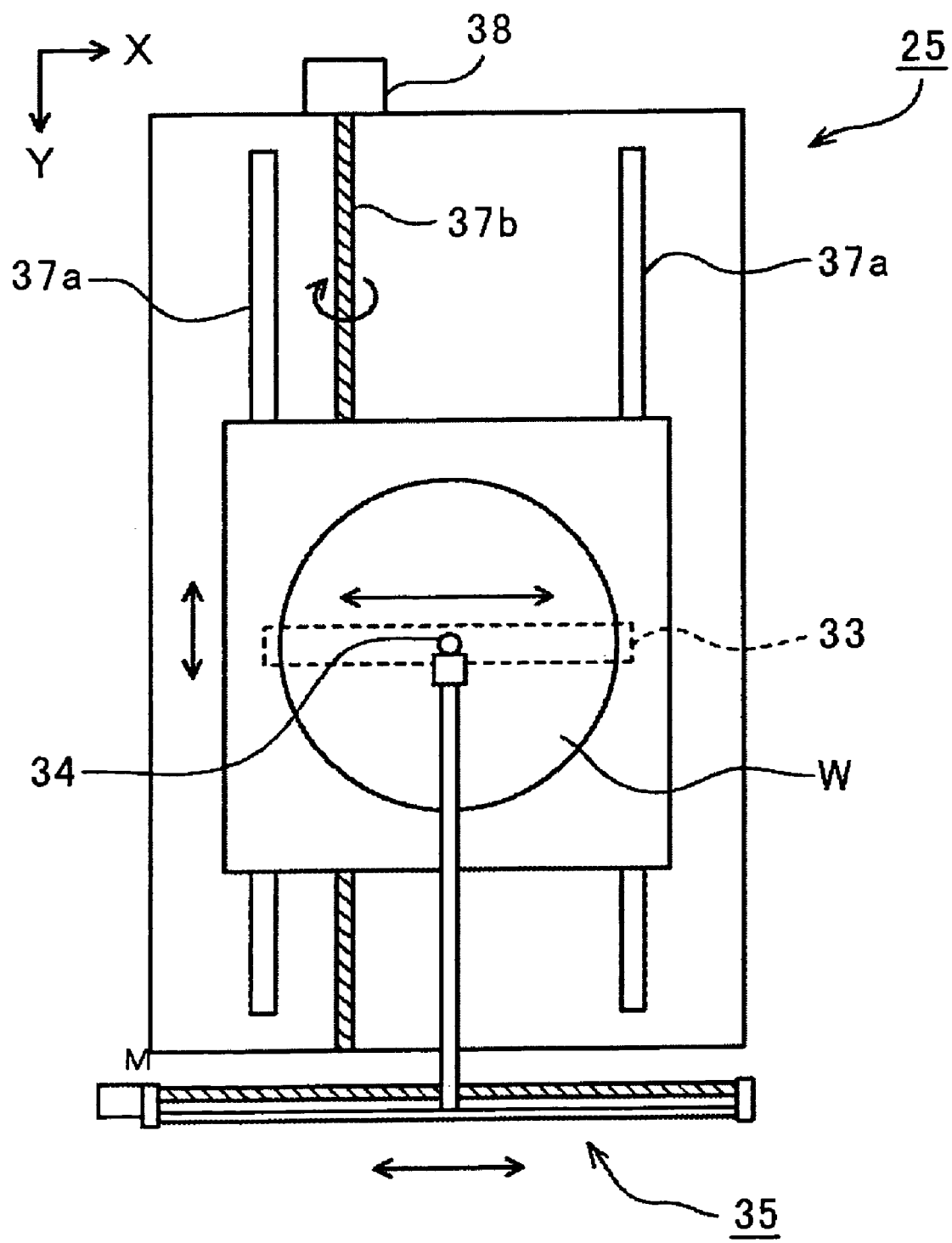
FIG. 5 is a plane view for explaining the coating unit in FIG. 4.

Next, explanation is made on the coating unit 25A with reference to FIG. 4 and FIG. 5. Although a casing which forms an outer body of the coating unit 25A is omitted here, for example, a hollow case body 30, whose side is formed with an opening (not shown) for carrying in/out the wafer W therethrough, is provided in the not shown casing. Inside the case body 30, a substrate holder 31 which horizontally holds the wafer W by vacuum-sucking the rear face of the wafer W and a raising and lowering mechanism 32 which supports the lower side of the substrate holder 31 and raises and lowers the substrate holder 31, are provided. The ceiling portion of the case body 30 is formed with a slit 33 extending in an X-direction, so that a nozzle 34 for supplying the resist solution that is the coating solution can be moved in the X-direction above the slit 33 by a driver 35 with a discharge hole 34a at the lower tip projecting into the case body 30 through the slit 33.

On the other hand, the substrate holder 31 and the raising and lowering mechanism 32 are integrated with a supporter 36 in a flat plate shape which is provided under the wafer held by the substrate holder 31 to face the rear face of the wafer. On the bottom face of the supporter 36, for example, two rails 37a extending in a Y-direction are disposed, and a ball screw 37b is provided in parallel to the rails 37a in the vicinity of the bottom face, so that a motor 38 rotates the ball screw 37b to cause the supporter 36 to move in the Y-direction guided by the rails 37a.

In the coating unit 25A, the wafer W carried into the coating unit 25A by the main carrier 24 is substantially horizontally held with the rear face thereof sucked by the substrate holder 31. Then, after the nozzle 34 is positioned above the wafer W, the nozzle 34 is moved in the X-direction while discharging the coating solution as well as the wafer W is intermittently moved in the Y-direction by the supporter 36, so that the coating solution is applied in a manner of a so-called drawing with one stroke.

Figure 6:
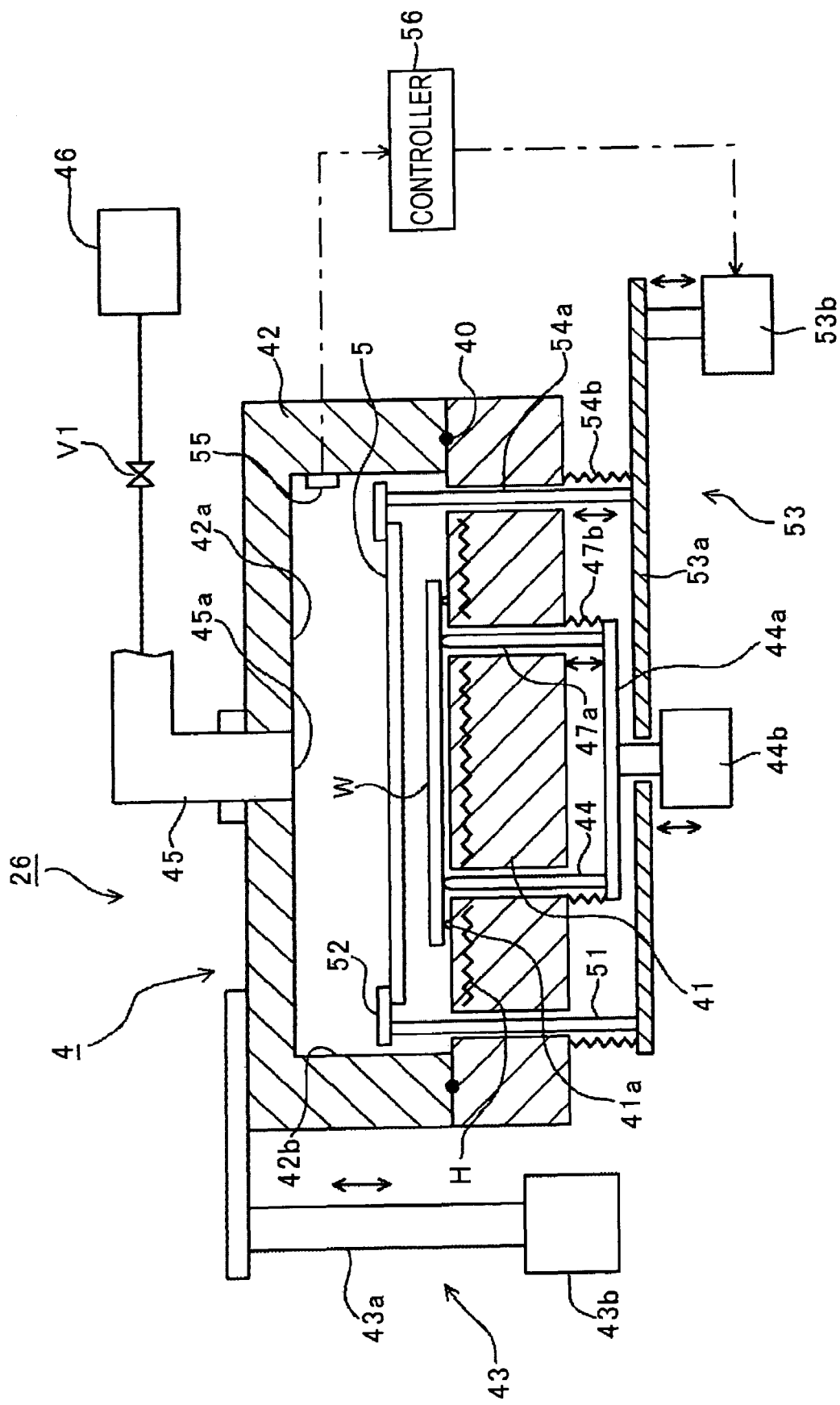
FIG. 6 is a vertical cross-sectional view showing a reduced-pressure drying unit installed in the shelf unit in FIG. 3.

Next, explanation is made on one embodiment of the reduced-pressure drying unit 26 realizing the reduced-pressure drying unit according to the present invention. In FIG. 6, numeral 41 denotes a mount constituted by a temperature regulating plate in which, for example, a Peltier element is embedded, an aluminum material, or the like The wafer W is held to be slightly lifted from the front face of the mount 41 by support pins 41a which slightly project from the mount. Above the mount 41, a lid body 42 is provided which is constituted by, for example, an aluminum material. The lid body 42 is made freely ascendable and descendable by the function of a raising and lowering mechanism 43 which is composed of a holding arm 43a, a driver 43b, and the like. The lid body 42, when lowered, comes into hermetically contact with the peripheral portion of the mount 41 through an O-ring 40 that is a sealing material to constitute a hermetic container 4 that makes the atmosphere in which the wafer W is located into a hermetic atmosphere.

In the vicinity of the front face of the mount 41, a heater H is embedded (see FIG. 6) for heating the wafer W in reduced-pressure drying, which is constituted by, for example, a resistance heating element or the like. Inside the mount 41, three lift pins 44 are provided therethrough to deliver and receive the wafer W to/from the main carrier 24, and raised and lowered by a first raising and lowering device 44b such as, for example, an air cylinder through a first raising and lowering plate 44a.

In order to suck the atmosphere in the hermetic container 4, a ceiling portion 42a of the lid body 42 is formed with an opening 45a to which one end of an exhaust pipe 45 forming an exhaust passage is connected which is made of, for example, stainless steel. The exhaust pipe 45 runs through a not shown casing of the reduced-pressure drying unit 26 and a not shown casing of the processing section S1 and via an opening and closing valve V1, and the other end thereof is connected to a vacuum pump 46 that is a vacuum exhauster provided, for example, in a clean room.

In a space facing the wafer W in the lid body 42, a current plate 5 that is a plate-like current member is provided in such a manner to face the wafer W mounted on the mount 41 and have a gap with respect to any of the ceiling portion 42a and side walls 42b of the lid body 42. The current plate 5 is connected with a plurality of, for example, three substantially vertical support rods 51 that are provided through the mount 41 and connecting members 52, for example, outside the wafer W The support rods 51 can be raised and lowered by a current plate raising and lowering mechanism 53 constituting a current member raising and lowering mechanism composed of a second raising and lowering plate 53a and a second raising and lowering device 53b such as, for example, an air cylinder, so that the current plate 5 is configured to be ascendable and descendable above the wafer W so as to change in height position with respect to the wafer W.

In order to prevent the atmosphere in which the wafer W is located from communicating with the external air via through holes 47a for the lift pins 44 and through holes 54a for the support rods 51 in this event, bellows 47b and 54b are provided between the peripheral portions of the first and second raising and lowering plates 44a and 53a and the mount 41 respectively. By providing the current plate 5 in the hermetic container 4 as described above, a uniform exhaust current is formed along inner walls of the lid body 42 in reduced-pressure drying.

The hermetic container 4 is provided with a pressure sensor 55 constituting a pressure detecting section for detecting the pressure in the container 4, for example, on the inner wall of the lid body 42, so that the height position of the current plate 5 can be changed by a controller 56 through the current plate raising and lowering mechanism 53 based on the detection value by the pressure sensor 55.

Next, a reduced-pressure drying method performed in such a reduced-pressure drying unit 26 is explained. First of all, the wafer W which has been coated with the resist solution that is the coating solution in the preceding step is carried to the reduced-pressure drying unit 26 by the main carrier 24. The carriage of the wafer W into the reduced-pressure drying unit 26 is performed in such a manner that a not shown arm of the main carrier 24 first approaches to a position above the mount 41 with the lid body 42 and the current plate 5 raised, then the lift pins 44 are raised to receive the wafer W from the arm, and thereafter the lift pins 44 are lowered.

Thereafter, the current plate 5 is lowered to an initial position, for example, a position where the distance between the front face of the wafer W and the rear face of the current plate 5 is 5 mm, and then the lid body 42 is lowered to form the hermetic container 4. Subsequently, the current plate 5 is once lowered to a position where the aforesaid distance is, for example, 3 mm, and then the opening and closing valve V1 is opened to start reducing the pressure by the vacuum pump 46. Then, the current plate 5 is lowered to a first position where the distance between the front face of the wafer W and the rear face of the current plate 5 is, for example, 1 mm to make a first distance (gap) between the front face of the wafer and the rear face of the current plate, and the pressure is reduced for a predetermined period.

The coating solution (the resist solution) applied to the front face of the wafer W is made by mixing the component of the resist film that is the coating film, the solvent, for example, a thinner or the like, and water. When the inside of the hermetic container 4 is made into the reduced-pressure atmosphere, the air in the container 4 and the solvent and water in the coating solution vaporize and are sucked to the exhaust pipe 45 side via the opening 45a. Since the exhaust current in the hermetic container 4 is formed to detour the current plate 5 in this event, solvent vapor vaporizing from the wafer W hits against the current plate 5 to change in direction outward and uniformly spreads in a radial direction together with the exhaust current toward the opening 45a.

As described above, an air current flowing outward from the center of the wafer W is generated between the wafer W and the current plate 5, and this flow of the air current becomes stronger the smaller the gap between the current plate 5 and the wafer W is, and the flow becomes weaker the larger the gap is. Accordingly, when the pressure reduction is performed in the state where the gap between the current plate 5 and the wafer W is made as small as 1 mm, the coating solution spreads by the strong air current spreading outward between the current plate 5 and the wafer W, so that the coating solution sufficiently spreads out to the peripheral region of the wafer W. In order to restrain a rounded shape of the coating solution at the peripheral region of the wafer W, when the coating solution is spread out to the peripheral region of the wafer W as described above, the current plate 5 is raised at a predetermined timing from the first position to a second position that is higher than the first position, for example, a position where the distance between the front face of the wafer W and the rear face of the current plate 5 is 5 mm to make a second distance (gap) that is larger than the first distance between the front face of the wafer and the rear face of the current plate, and the reduced-pressure drying is continued for a predetermined period.

In this arrangement, the gap between the current plate 5 and the wafer W increases to weaken the air current flowing outward, which restrains liquid flow of the coating solution. This prevents the coating solution from increasing in thickness at the peripheral region of the wafer, resulting in improved in-plane uniformity of the thickness of the coating film. The reduced-pressure drying is performed as described above to vaporize the solvent and water from the coating solution on the front face of the wafer so as to dry the coating film. Thereafter, the inside of the container 4 is returned to a normal pressure by leaking the air therein, the lid body 42 and the current plate 5 are raised before the lift pins 44 are raised, and then the wafer W is delivered to the main carrier 24.

As described above, this embodiment is characterized in that the height position of the current plate 5 is changed to thereby change the magnitude of the gap between the current plate 5 and the wafer W in reduced-pressure drying processing, thereby controlling the liquid flow of the coating solution on the wafer W so as to improve the uniformity of the film thickness of the coating film. The timing of changing the height position of the current plate 5 in such an arrangement is determined based on the pressure in the hermetic container 4, and the height position of the current plate 5 is changed via the controller 56.

Figure 7:
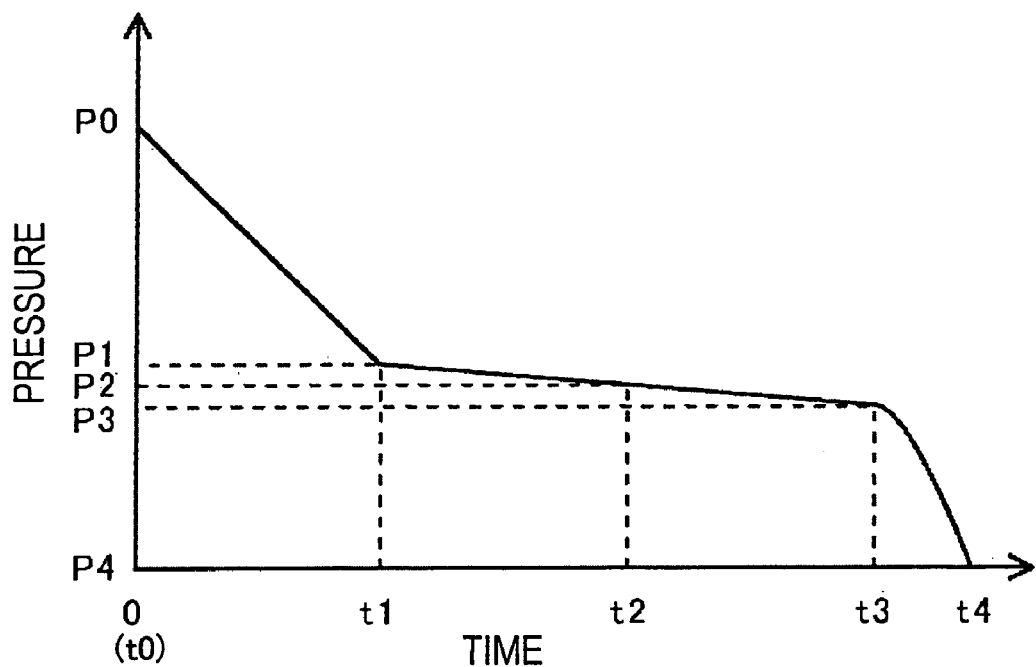
FIG. 7 is a characteristic diagram showing a curved line of a pressure in the reduced-pressure drying unit.

In other words, when the hermetic container 4 is reduced in pressure, the pressure in the hermetic container 4 changes as a pressure curved line shown in FIG. 7. More specifically, the air in the hermetic container 4 is kept exhausted from time to t0 time t1, during which the pressure inside the hermetic container 4 is sharply reduced from pressure P0 to pressure P1. Subsequently, time t1 is a point of time when the thinner that is the solvent starts vaporizing from the coating solution on the front face of the wafer, and the thinner keeps vaporizing from time t1 to time t3, during which the pressure inside the container 4 is gradually reduced from pressure P1 to pressure P3. Then, time t3 is a point of time when the water contained in the coating solution on the front face of the wafer starts vaporizing, and the thinner remaining in the coating solution and the water keep vaporizing from time t3 to time t4, during which the pressure inside the hermetic container 4 is again sharply reduced from pressure P3 to pressure P4.

In the case of the inside of the hermetic container 4 kept at a constant temperature, the thinner is vaporizing (evaporating) even in the state where the pressure inside the hermetic container 4 is not reduced, and when the pressure inside the hermetic container 4 is sharply reduced, the thinner immediately reaches its boiling point to a state of vaporizing from below the surface of the thinner. However, if the thinner is allowed to vaporize from below the surface thereof as described above, the coating film becomes rough. Therefore, the displacement by the vacuum pump 46 is determined so that the decrease in pressure in the container 4 becomes a bit less sharp in the above-described embodiment. When the pumping speed by the vacuum pump 46 is set a bit low, the thinner vigorously vaporizes a short while before the boiling point. In accordance with the balance between existence of the gas which vaporized at that time and the pumping speed, the pressure in the container 4 gradually inclines downward such as when ranging from pressure P1 to pressure P3. In the present invention, "the state of the thinner vigorously vaporizing" is called "vaporization of the thinner", and this state shall include states of the thinner at the boiling point and before the boiling point.

As for the state of the coating solution on the front face of the wafer, the fluidity of the coating solution is influenced by the vaporization of the thinner that is the solvent and further the fluidity is great at the beginning of the vaporization because of a large amount of solvent, and thus it is necessary to change the height position of the current plate 5 in the vaporization of the solvent. Specifically, the current plate 5 may be located at any height position from time t0 to time t1 during which the air in the container 4 is exhausted and from time t3 to time t4 during which the water vaporizes from the coating solution on the front face of the wafer, and it is required to control the height position of the current plate 5 from time t1 to time t3 during which the thinner that is the solvent is vaporizing from the coating solution.

During the vaporization of the solvent, it is necessary to increase the fluidity of the coating solution to thereby sufficiently spread out the coating solution to the peripheral region of the wafer in the early period, and thereafter it is necessary to restrain the fluidity of the coating solution to prevent the coating solution at the peripheral region of the wafer from becoming too high. The fluidity of the coating solution here changes in accordance with the magnitude of the air current generated between the wafer W and the current plate 5 such that the air current becomes stronger the smaller the gap between the wafer W and the current plate 5 is, and the air current becomes weaker the larger the gap is, as already described.

In this event, the pressure in the container 4 is gradually reduced from pressure P1 to pressure P3 in a period from time t1 to time t3 as described above, and thus at the time (time t2) when the pressure reaches a set pressure P2 which is previously obtained, the current plate 5 is raised from the first position to the second position. Further, the height of the current plate 5 may be set at any height before time t1 and after time t3 because it does not influence the coating film. In this example, the height of the current plate 5 is set at the first position from time t1 to time t2 and is set at the second position from time t2 to time t4 in order to eliminate an effort to move the current plate 5. The set pressure P2, the first height position (the first gap), and the second height position (the second gap) are appropriately selected here in accordance with the size of the wafer, processing conditions such as the temperature and the pressure inside the hermetic container 4, the component of the coating solution, and the like.

According to the above-described embodiment, the height position of the current plate 5 is changed to thereby change the magnitude of the gap between the current plate 5 and the wafer W in reduced-pressure drying processing, thereby controlling the liquid flow of the coating solution. Therefore, it is possible to control the film thickness of the coating film on the front face of the wafer, thereby restraining a rounded shape and an accumulated portion of the coating solution at the peripheral region of the wafer to uniform the film thicknesses at the center part and the peripheral region of the coating film, resulting in improved uniformity of the thickness. This makes it possible to fabricate chips even in the vicinity of the outer periphery of the wafer to improve the yield of chips per wafer. Further, the improved uniformity of the film thickness of the coating film stables the film thickness to enable stable fabrication of devices, resulting in improved throughput.

Further, the height of the current plate 5 is controlled based on the pressure in the hermetic container 4 to bring about a high reliability in the timing of changing the height position of the current plate 5, so that processing can be performed stably at all times to provide a high uniformity of the film thickness of the coating film, resulting in high throughput.

In this embodiment, the wafer W is mounted on the mount 41 and the lid body 42 is lowered to form the hermetic container 4, and thereafter the current plate 5 is first lowered to the first position, the opening and closing valve V1 is opened, and the vacuum pump 46 starts reduction of pressure and keeps the reduction for a predetermined period. Then, when the pressure in the container 4 reaches the pressure P2, the current plate 5 may be raised from the first position to the second position and reduced-pressure drying may be continued for a predetermined period.

Next, other embodiments of the reduced-pressure drying unit 26 will be individually explained, and the same members are assigned the same numerals in the drawings hereafter. The below examples may be combined with the already-described reduced-pressure drying unit 26, or other embodiments may be combined with each other.

Figure 8:
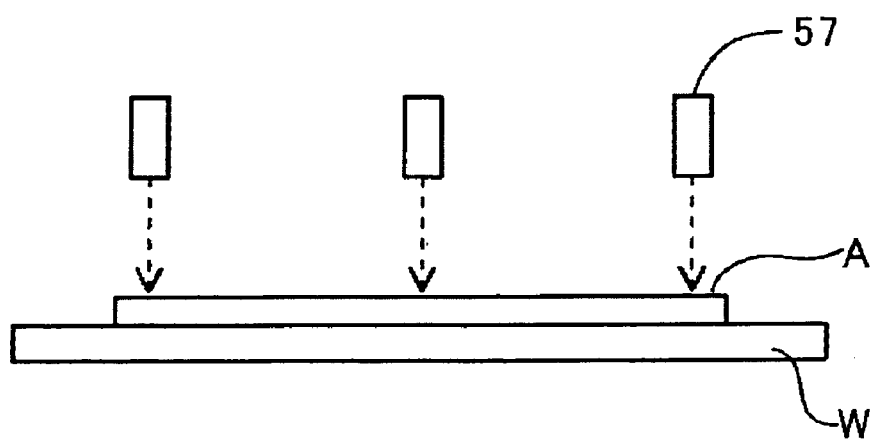
FIG. 8 is a side view for explaining another embodiment of the reduced-pressure drying unit according to the present invention.

In the example in FIG. 8, instead of controlling the height of the current plate 5 based on the pressure in the hermetic container 4, the film thickness of a coating solution A on the front face of the wafer W is measured by a film thickness sensor 57 which utilizes, for example, a CCD or light to control the height of the current plate 5 based on the measurement. In this case, the control is conducted such that, for example, the film thickness at the center part and the film thickness at the peripheral part of the coating solution on the front face of the wafer W are measured and the difference between the film thicknesses is calculated to raise the current plate in height from the first position to the second position when a value of the above difference becomes a predetermined value or lower. In this case, a high uniformity of the film thickness of the coating film can also be secured so that a high throughput can be obtained.

Figure 9:
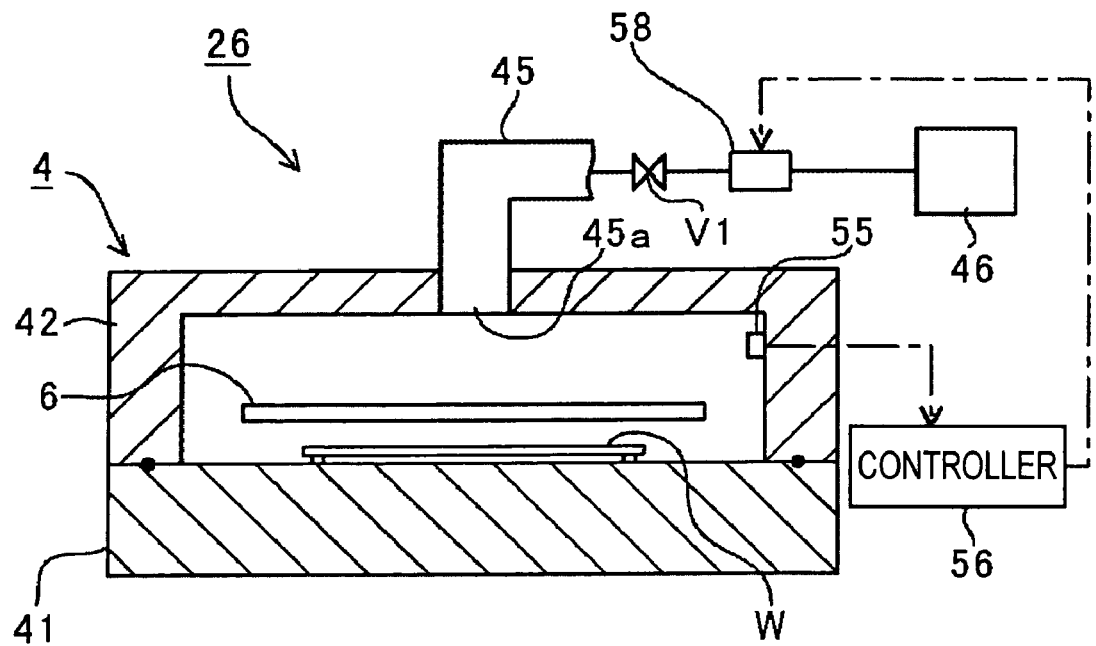
FIG. 9 is a cross-sectional view for explaining still another embodiment of the reduced-pressure drying unit according to the present invention.
Figure 10:
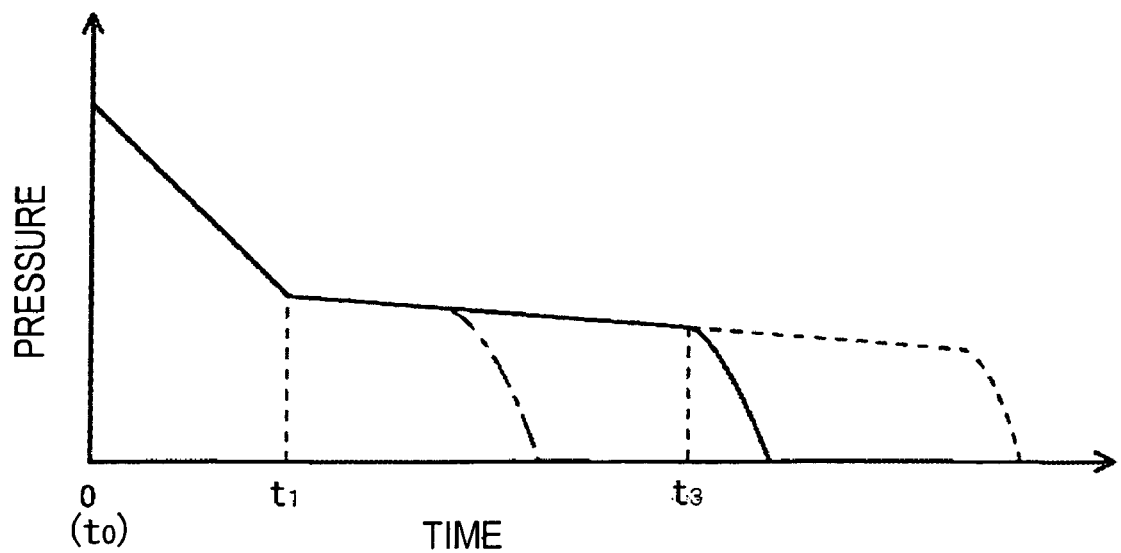
FIG. 10 is a characteristic diagram showing a curved line of a pressure in the reduced-pressure drying unit.

Meanwhile, the vaporization period of the solvent may be controlled as in the following manner. In the example shown in FIG. 9, a pressure adjuster 58, which is constituted, for example, by a pressure adjusting valve, is provided between the exhaust pipe 45 and the vacuum pump 46. The pressure in the hermetic container 4 is detected by the pressure sensor 55, and the pressure adjuster 58 is controlled by the controller 56 based on the detection value to control the displacement (pumping speed) in the hermetic container 4, thereby adjusting the vaporization period of the solvent in the coating solution. When, for example, a pressure adjusting valve is used as the pressure adjuster 58, the displacement can be controlled by adjusting the opening of the valve. In this case, as shown in FIG. 10, while a change in the displacement does not change the gradient of the pressure curved line from time t1 to time t3, an increase or decrease in the pumping speed during a period from time t1 to time t3 makes it possible to adjust the vaporization period of the solvent. More specifically, an increase in the displacement reduces the vaporization period of the solvent as shown by a one-dotted chain line in FIG. 10, and a decrease in the displacement increases the vaporization period of the solvent as shown by a dotted line in FIG. 10.

In the case of, for example, a coating solution using a thinner, which quickly vaporizes, as its solvent being applied on the front face of the wafer, it might be difficult to precisely control the spreading state of the coating solution by controlling the height position of the current plate 5 because the spreading rate of the coating solution is high. However, the vaporization period of the solvent in the coating solution is increased as in this example results in a decrease in the spreading rate of the coating solution. Therefore, it is possible to sufficiently control the spreading state of the coating solution, even if it is the coating solution using a thinner, which quickly vaporizes, as its solvent, by controlling the height position of the current plate 5, so that the control of the film thickness of the coating solution can easily be conducted.

Figure 11:
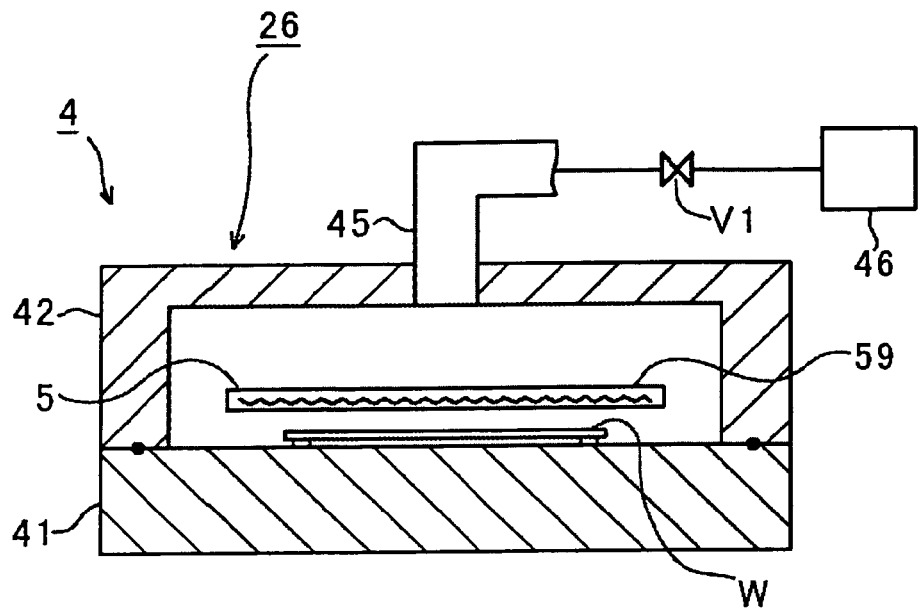
FIG. 11 is a cross-sectional view for explaining still another embodiment of the reduced-pressure drying unit according to the present invention.

The example shown in FIG. 11 has a configuration in which, inside the hermetic container 4, a heater is provided for heating the wafer W at a point of time t3 on the curved line of the pressure inside the hermetic container 4 shown in FIG. 7. The heater may be provided at any place inside the hermetic container 4 such as in the mount 41 or in the lid body 42, and a heater 59 composed of, for example, a resistance heating element is provided, for example, inside the current plate 5 in this example.

As described above, the heating of the wafer W at the point of time t3 on the curved line of the pressure inside the hermetic container 4 shown in FIG. 7 increases the vaporization rates of the thinner remaining in the coating solution on the front face of the wafer and water contained in the coating solution due to the heating. Therefore, the thinner quickly vaporizes by the heating even when, for example, a coating solution using a thinner, which slowly vaporizes, as its solvent is applied to the front face of the wafer and when a long period is required for vaporization of all the thinner. Accordingly, the period required for the reduced-pressure drying processing is reduced as compared to the case without heating. The reason why the heating is started at the point of time t3 is that the film thickness can be more precisely controlled at a lower vaporization rate of the solvent in the step of controlling the film thickness of the coating solution from time t1 to time t3.

In this case, the reduction in the pressure inside the hermetic container 4 may be stopped or not during the heating by the heater 59. The timing of turning on the heater 59 may be determined based on the detection value of the pressure inside the hermetic container 4 or based on the detection value of the film thickness of the coating solution. Further it is also adoptable to perform the heating of the wafer W and the adjustment of the displacement in the hermetic container 4 as shown in FIG. 9 in combination, to precisely control the film thickness by increasing the period from time t1 to time t3, and to adjust the total processing period required for the reduced-pressure drying step by reducing the period after time t3.

In order to spread the coating solution uniformly in the wafer plane in the above configuration, it is important to arrange the current plate 5 in parallel to the wafer W, and thus an example of a mechanism provided to make the current plate 5 parallel to the wafer W is explained next with reference to FIG. 12 to FIG. 15.

Figure 12:
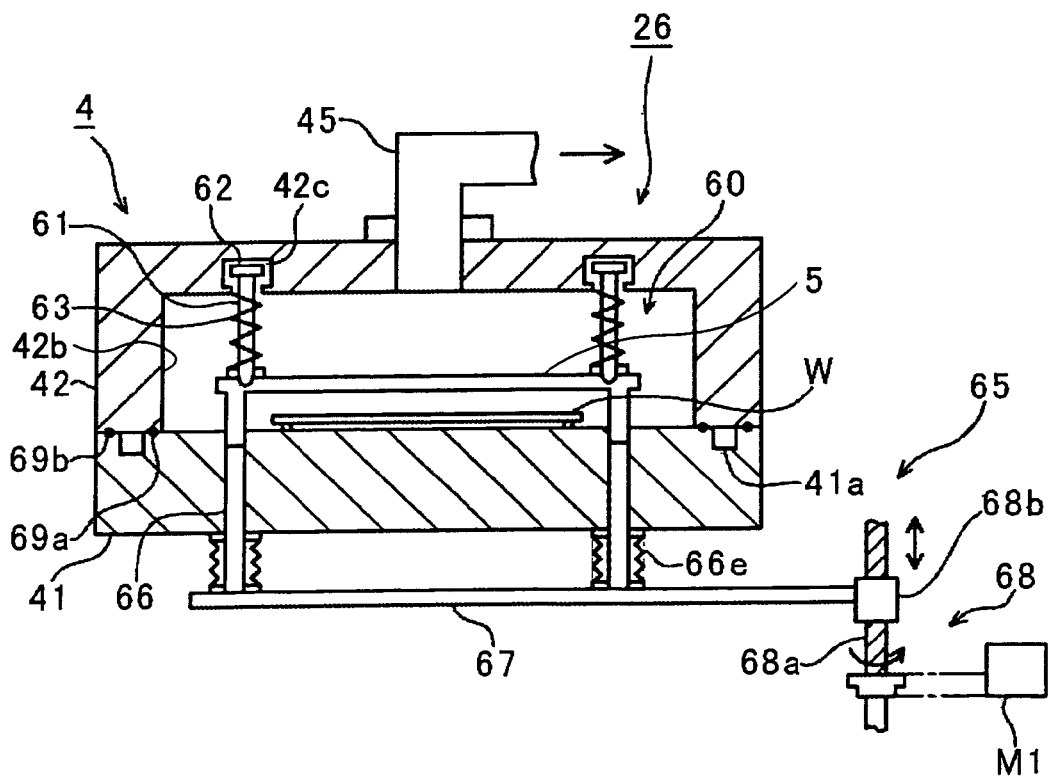
FIG. 12 is a cross-sectional view for explaining still another embodiment of the reduced-pressure drying unit according to the present invention.
Figure 13:
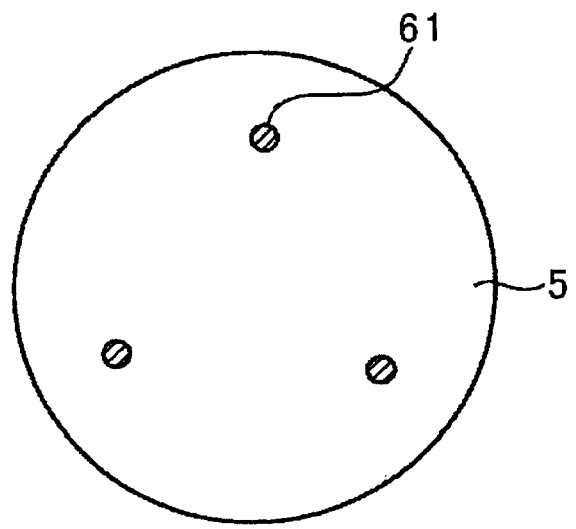
FIG. 13 is a plane view for explaining still another embodiment of the reduced-pressure drying unit according to the present invention.
Figure 14:
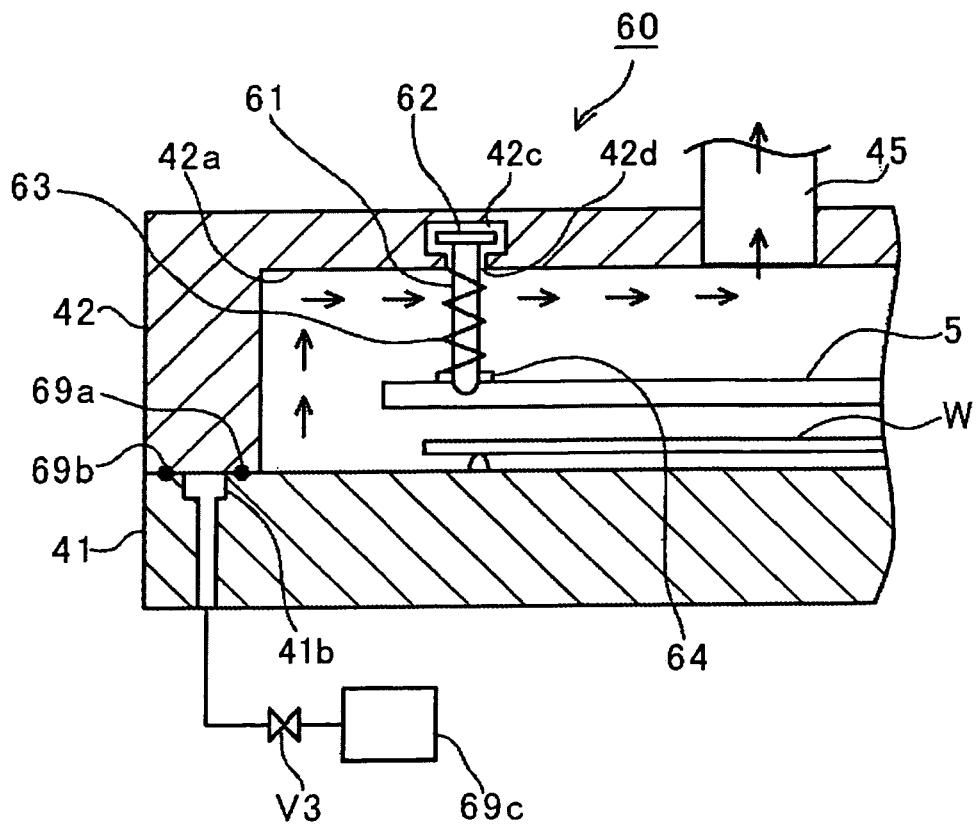
FIG. 14 is a cross-sectional view for explaining still another embodiment of the reduced-pressure drying unit according to the present invention.

In FIG. 12, numeral 60 denotes a hang-supporter for hang-holding the current plate 5 on the lid body 42, and supporters 60 are connected to the current plate 5 at plural, for example, three points as shown in FIG. 13 so that the current plate 5 is hang-supported by, for example, three supporters 60. Each of the supporter 60 comprises, as shown in FIG. 14, a substantially vertical holding rod 61, a collar portion 62 provided at the top end of the holding rod 61, and a spring portion 63 wound around the holding rod 61, in which the bottom end of the holding rod 61 is joined to the front face of the current plate 5 facing the lid body 42 with a spherical joint portion 64.

In the ceiling portion 42a of the lid body 42 facing the current plate 5, a recessed portion 42b having a size enough for the collar portion 62 to move therein is formed at a position facing the holding rod 61, and an opening 42c of the recessed portion 42b is made narrow so that the holding rod 61 can pass therethrough but the collar portion 62 cannot. Thereby, when the current plate 5 is raised and lowered by a later-described current plate raising and lowering mechanism, the holding rod 61 is ascendable and descendable by the height of the recessed portion 42d while hang-supporting the current plate 5.

Figure 15:
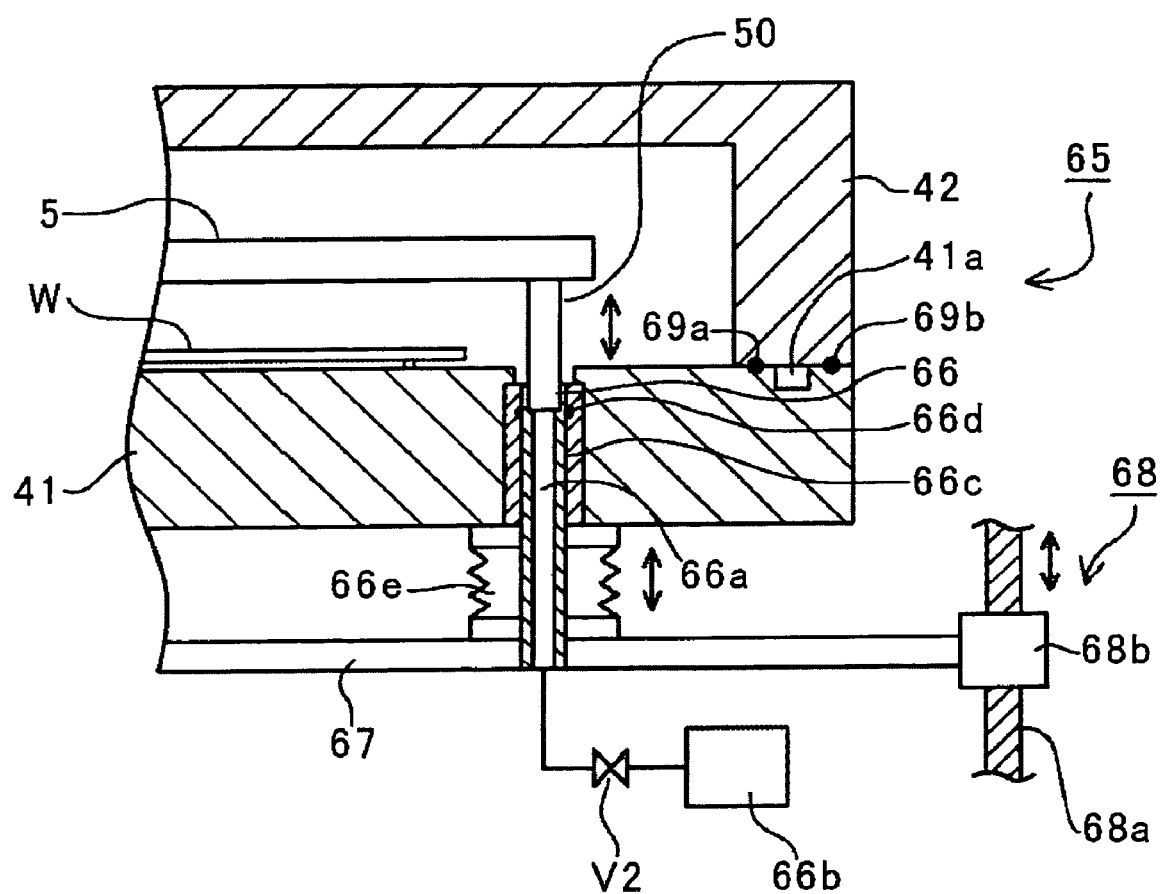
FIG. 15 is a cross-sectional view for explaining still another embodiment of the reduced-pressure drying unit according to the present invention.

Next, a current plate raising and lowering mechanism 65 constituting a current member raising and lowering mechanism is explained. The current plate 5 comprises, as shown in FIG. 12 and FIG. 15, a plurality of, for example, three leg parts 50 at positions on the rear face side thereof and outside the wafer W mounted on the mount 41. The leg part 50 is formed to extend substantially vertically into the inside of the front face of the mount 41 located thereunder, and the bottom end thereof is connected to a later-described raising and lowering rod.

The current plate raising and lowering mechanism 65 comprises, as shown in FIG. 12 and FIG. 15, a plurality of, for example, three raising and lowering rods 66 for pressing the rear face of the current plate 5 through the leg parts 50, a raising and lowering plate 67 connected to the bottom end of all of the raising and lowering rods 66, and a raising and lowering device 68 for raising and lowering the raising and lowering plate 67. The raising and lowering rods 66 are provided such as to be raised and lowered at positions corresponding to the leg parts 50 of the current plate 5. Further, the leg parts 50 of the current plate 5, the raising and lowering rods 66, and the raising and lowering plate 67 are configured so that when the raising and lowering plate 67 raises and lowers the raising and lowering rods 66, the current plate 5 raised and lowered by the raising and lowering rods 66 can be kept highly parallel to the wafer W mounted on the mount 41.

A ventilation hole 66a having a bore diameter, for example, 2 φ runs through the inside of the raising and lowering rod 66, and a region in the vicinity of the top end of the raising and lowering rod 66 is formed to have a size enough for the bottom end of the leg part 50 of the current plate 5 to be inserted. The other end side of the raising and lowering rod 66 which is not in contact with the current plate 5 is connected to a first exhauster 66b through an opening and closing valve V2. Numeral 66c denotes a though hole of the raising and lowering rod 66, and an O-ring 66d constituting a sealing member is provided between the though hole 66c and the raising and lowering rod 66. Between the mount 41 around the raising and lowering rod 66 and the raising and lowering plate 67, a bellows 66e is provided for preventing the inside of the hermetic container 4 from communicating with the external air through the though hole 66c.

The raising and lowering device 68 comprises, as shown in FIG. 12, a substantially vertical ball screw 68a, a supporter 68b connected to one end of the raising and lowering plate 67, and a motor M1 for rotating the ball screw 68a. The motor M1 rotates the ball screw 68a to cause the supporter 68b to ascend and descend along the ball screw 68a, whereby the current plate 5 is raised and lowered through the raising and lowering plate 67 and the raising and lowering rods 66 to be at a precise height. As a result, the current plate 5 raised and lowered by the raising and lowering rods 66 is raised and lowered while kept highly parallel to the wafer W mounted on the mount 41.

Further, the hermetic container 4 in this example is provided with O-rings 69a and 69b constituting two sealing members having different inner diameters at a connecting part between the mount 41 and the lid body 42, and a groove portion 41b is formed, as shown in FIG. 14, between the O-rings 69a and 69b, and the groove portion 41b is connected to a second exhauster 69c through an opening and closing valve V3.

In such a configuration, the current plate 5 is hang-supported by the hang-supporter 60 on the lid body 42 while kept in contact with the raising and lowering mechanism 65 through the leg parts 50, so that the current plate 5 is raised and lowered with the ascent and descent of the lid body 42. For changing the height position of the current plate 5 in the reduced-pressure drying processing, the raising and lowering rods 66 of the current plate raising and lowering mechanism 65 push the rear face of the current plate 5 through the leg parts 50. In this event, for example, in the above-described example, the current plate 5 is changed in height, in the reduced-pressure drying processing, between the first position 1 mm above the front face of the wafer W and the second position 5 mm above the front face. When the current plate 5 is first located at the first position, the tips of the raising and lowering rods 66 are made contact with the leg parts 50 of the current plate 5 and the inside of the raising and lowering rods 66 are sucked by the first exhauster 66b by opening the opening and closing valve V2.

This brings the current plate 5 into contact with the raising and lowering rods 66 inside the mount 41, so that particles generated in the vicinity of the connecting parts between the leg parts 50 of the current plate 5 and the raising and lowering rods 66 in the time of raising and lowering influence a little the processing in the container 4. Further, the particles generated in the vicinity of the connecting parts between them are discharged through the raising and lowering rods 66 by the suction of the connecting parts between them, so that contamination with the particles can be prevented further. The current plate 5 and the raising and lowering rods 66 may be configured to directly contact with each other in this event, but the quantity of generated particles increases because they are in contact with each other at a position higher than the mount 41 in this case.

Since the parallelism of the current plate 5 is determined by the three raising and lowering rods 66 and the current plate 5 itself is hang-supported on the lid body 42, a subtle gradient might occur in the current plate 5 when raised and lowered. However, since the current plate 5 and the holding rods 61 are connected to each other with the spherical joint portions 64, the gradient of the current plate 5 is absorbed by the spherical joint portions 64, so that the current plate 5 raised and lowered by the raising and lowering rods 66 are raised and lowered while keeping a high parallelism to the wafer W mounted on the mount 41. This makes it possible to uniformly spread the coating solution on the front face of the wafer W so as to secure a higher uniformity of the film thickness.

Further, in this example, double O-rings 69a and 69b are provided and the reduced-pressure drying processing is performed while the air therebetween sucked by the second exhauster 69c by opening the opening and closing valve V3. This permits the mount 41 and the lid body 42 to attach by the suction to each other more firmly, thereby preventing the external air from entering the container 4 through the space between the mount 41 and the lid body 42 when the air inside the hermetic container 4 is exhausted by the vacuum pump 46.

Figure 16:
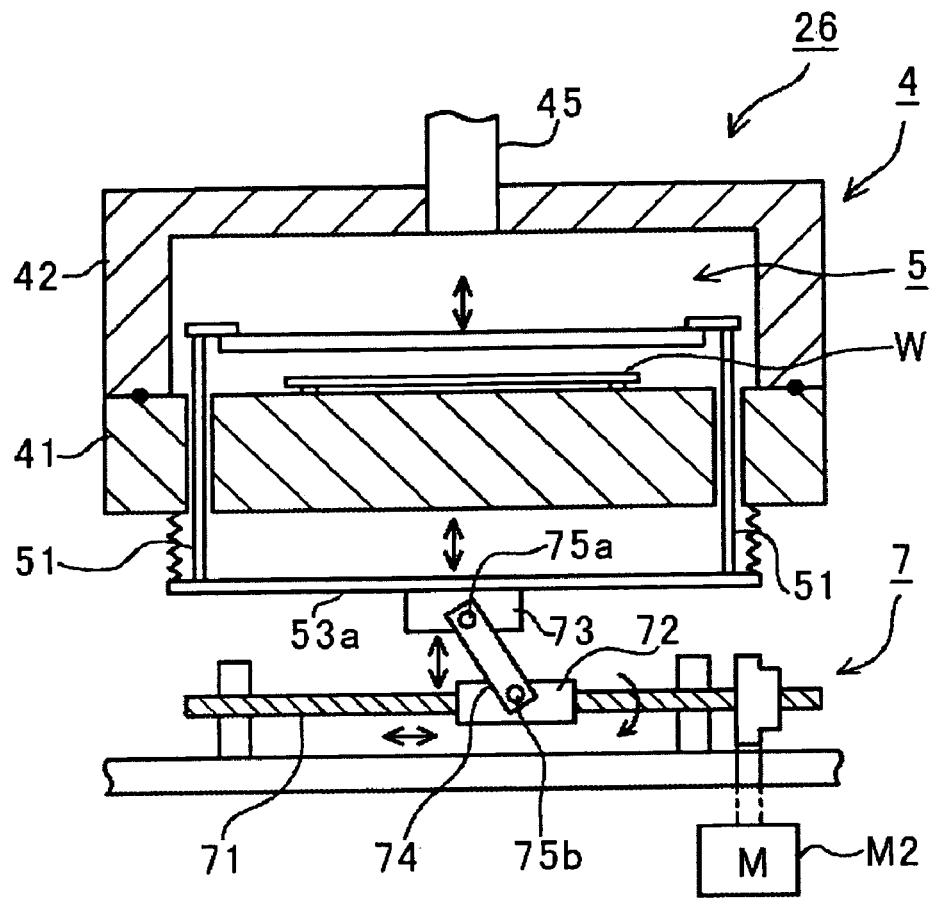
FIG. 16 is a cross-sectional view for explaining still another embodiment of the reduced-pressure drying unit according to the present invention.

In the reduced-pressure drying unit 26 of the present invention, the current plate raising and lowering mechanism constituting the current member raising and lowering mechanism may be configured as shown in FIG. 16. Numeral 71 in FIG. 16 denotes a substantially horizontal ball screw and numeral 72 denotes a supporter, in which a motor M2 rotates the ball screw 71 to cause the supporter 72 to move horizontally along the ball screw 71.

On the other hand, a joint-connected part 73 is provided on the rear face side of the second raising and lowering plate which is denoted by numeral 53a in FIG. 16, and the joint-connected part 73 and the supporter 72 are connected to respective ends of a joint 74 in the shape of an elongated plate with rotation shafts 75a and 75b respectively. Thereby, when the supporter 72 is located at a position apart from the joint-connected part 73, the joint 74 is placed such that the longitudinal direction thereof is substantially horizontal, so that the current plate 5 is disposed at a position close to the wafer W. The supporter 72 is moved to a position close to the joint-connected part 73 by rotating the ball screw 71, whereby the longitudinal direction of the joint 74 gradually becomes closer to vertical so that the current plate 5 is raised to be apart from the wafer W (to be located at a higher position). As described above, in this example, the height position of the current plate 5 is appropriately determined by adjusting the longitudinal length of the joint 74 and the angle formed between the longitudinal direction of the joint 74 and the wafer W.

In such a configuration, a mechanism that the supporter 72 is accurately moved in the horizontal direction by the ball screw 71 and a mechanism that the supporter 72 and the second raising and lowering plate 53a are connected with the joint 74 are combined to change the height position of the current plate 5 through the joint 74 by moving the supporter 72. Accordingly, the height of the current plate 5 can slowly be changed by decreasing the rotation speed of the ball screw 71 at the beginning of changing the height of the current plate 5. This can prevent air turbulence when the solvent contained in the coating solution on the front face of the wafer W, resulting in higher uniformity of the film thickness of the coating film.

Figure 17:
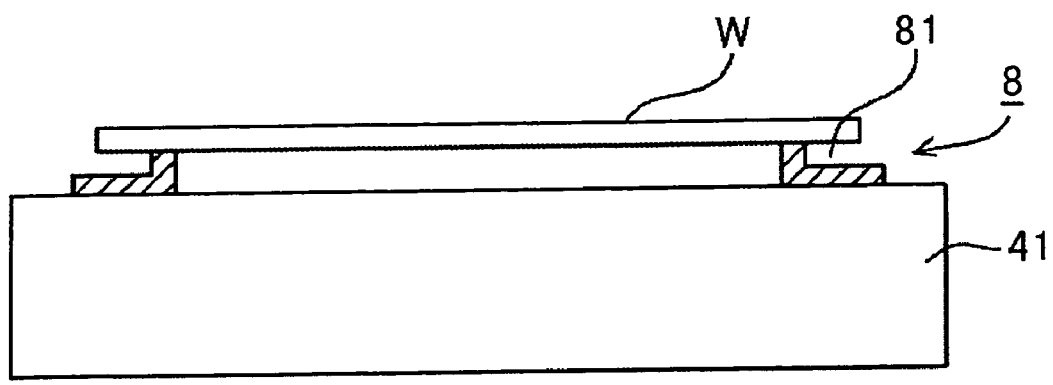
FIG. 17 is a side view for explaining still another embodiment of the reduced-pressure drying unit according to the present invention.
Figure 18:
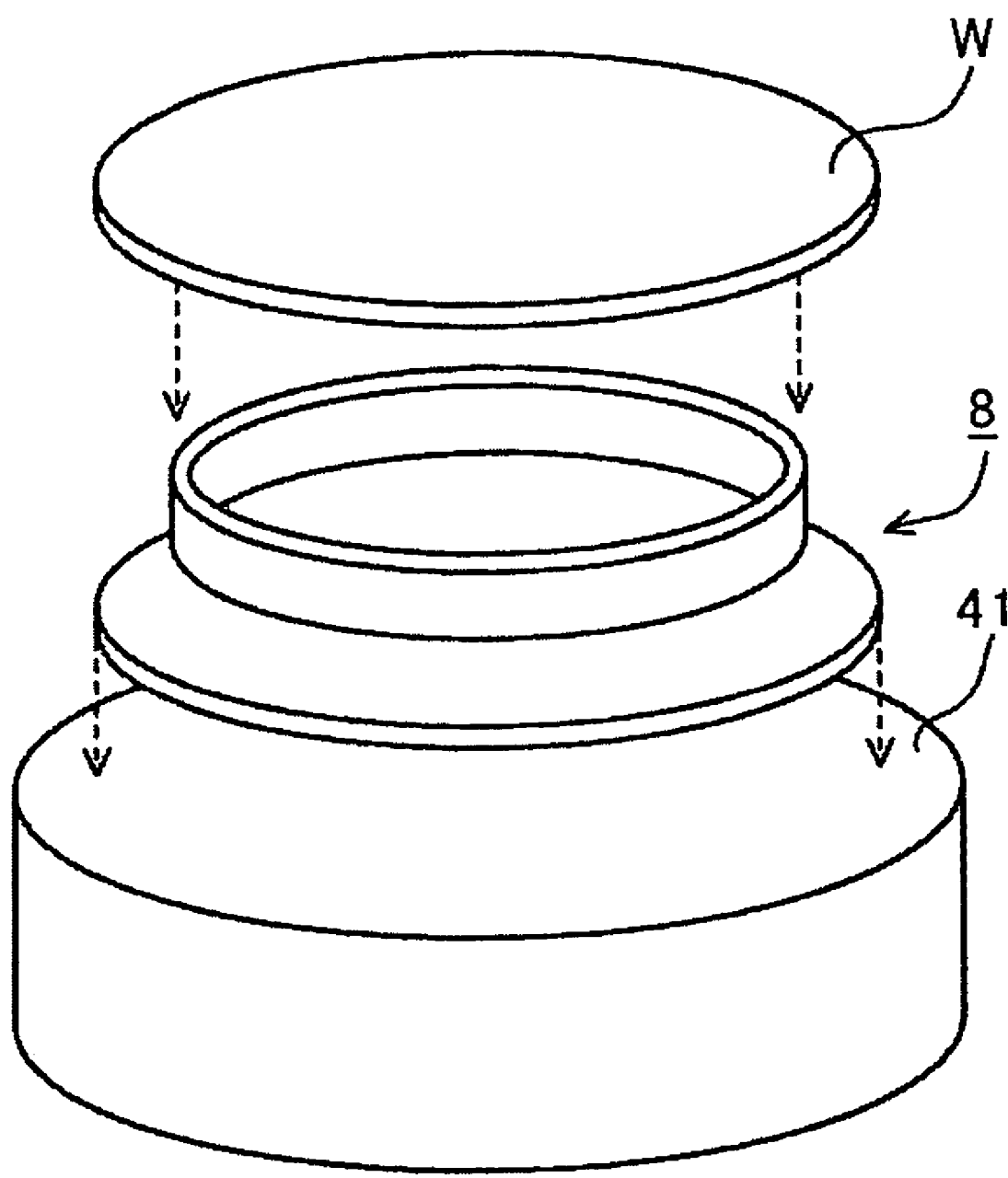
FIG. 18 is a perspective view showing a part of the still another embodiment.

Next, still another embodiment of the reduced-pressure drying unit 26 of the present invention is explained with FIG. 17 and FIG. 18. This embodiment provides a thermal change to the peripheral region of the wafer W by providing a member in contact with the peripheral region of the rear face of the wafer W, on the mount 41 including the heater H therein. Specifically, a ring member 8, which forms an annular member having a cross section, for example, in the shape of the letter L, is provided on the mount 41 constituting the hermetic container 4, so that the top face of the ring member 8 supports the peripheral part of the rear face of the wafer W. The ring member 8 is made of, for example, aluminum, stainless steel, ceramics, or the like which is different in heat conductivity from the mount 41.

In such a configuration, heat conduction from the mount 41 changes in accordance with the material of the ring member 8 and a gap 81 formed between the ring member 8 and the rear face of the wafer W. Therefore, the temperature of the wafer W varies between the center region and a region in the vicinity of a portion in contact with the ring member 8 (the peripheral region of the wafer), whereby the vaporization rate of the solvent varies between the center region and the peripheral region of the wafer. More specifically, as the temperature of the wafer W rises, the vaporization rate of the solvent in the region increases, and as the temperature drops, the vaporization rate of the solvent in the region decreases. Accordingly, by conducting a control such that the temperature of the wafer varies in plane by the difference in heat conductivity, the vaporization rate of the solvent differs in plane, so that the film thickness can be controlled in the wafer plane as described above.

In this example, the vaporization of the solvent in the coating solution is controlled by the combination of the change in the height position of the current plate 5 and the variation in the temperature in wafer plane as already described, thereby making it possible to conduct a control so that the film thickness of the coating film becomes uniform including the portion in the vicinity of the outer periphery of the wafer. Therefore, even if an outer peripheral region, outside the circuit formation region of the wafer, which is to be discharged is within as few as 5 mm from the outer periphery, the coating film can be formed having a sufficiently uniform film thickness also in the region in the vicinity of the outer periphery.

In this case, the ring member 8 may be of a type such that the entire top face of the ring member is in contact with the rear face of the peripheral region of the wafer W other than one having a cross section in the shape of the letter L. In this application, the temperature of the wafer is adjusted within the plane by the heat conductivity in the vicinity of a portion of the ring member 8 in contact with the wafer W, in which the shape and the material of the ring member 8 and the position and the size of the contact portion thereof with the wafer are appropriately selected in accordance with the type of the coating film to be formed and other processing conditions.

Further, in this embodiment, the ring member 8 is provided to vary the heat conduction in the center region and at the peripheral region of the wafer W, thereby adjusting the temperature of the wafer W in the plane so as to control the film thickness of the coating film. Therefore, this embodiment may be configured such that the above-described current plate is not provided, and configured such that the current plate is provided but its height position is not changed.

In the above embodiment, the wafer is delivered to the ring member 8, and, in this case, center positions of the ring member 8 and the wafer easily deviate from each other when the wafer is mounted on the ring member 8. Since the deviation of the center position of the wafer as described above decrease the uniformity of the film thickness of the coating film, it is important to deliver the wafer onto the ring member 8 with the center positions of the ring member 8 and the wafer W aligned. Next, a method of aligning the center positions of the ring member 8 and the wafer W is explained.

Figure 19:
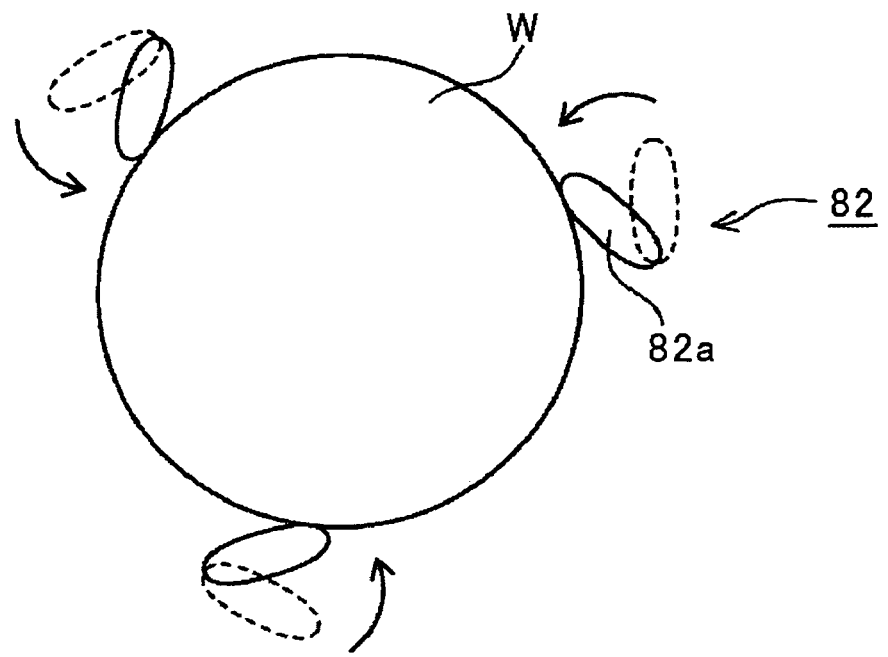
FIG. 19 is a plane view for explaining a method for aligning a wafer with a mount.

In this method, the wafer W is first delivered onto the ring member 8, and thereafter, for example, as shown in FIG. 19, a plurality of, for example, three aligning members 82 which are provided outside the wafer W and apart from the center position of the ring member 8 by equal distances are synchronously moved from waiting positions outside the wafer to alignment positions in contact with the outer edge of the wafer W respectively to push the wafer W into alignment.

Each of the alignment members 82 comprises a plate-like body 82a so that a part of a side edge of the plate-like body 82a pushes a part of the outer edge of the wafer W Further one end of the plate-like body 82a is connected to a substantially vertical rotation shaft 83b, a pulley 83a is connected to the other end of the rotation shaft 83b, and a belt is stretched between the pulleys 83a of the rotation shafts 83b. Thereby, any rotation shaft 83b is rotated by a not shown motor to cause all the rotation shafts 83b to rotate synchronously.

Figure 20:
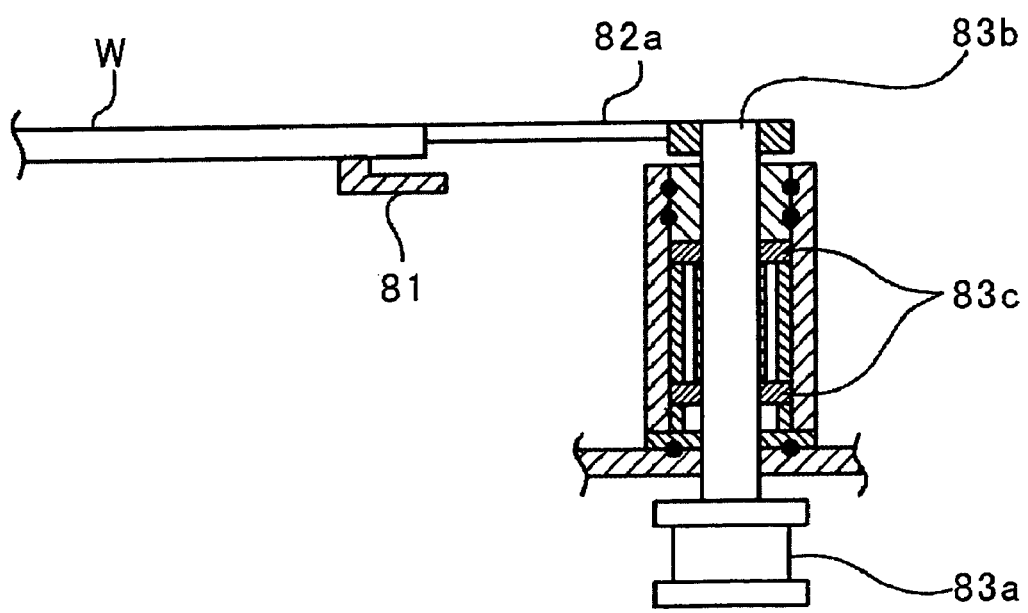
FIG. 20 is a cross-sectional view for explaining the above method.

The plate-like bodies 82a of the aligning members 82 are synchronously rotation driven from the waiting positions to the alignment positions in the above manner. The three aligning members 82 are configured to be moved to the alignment positions to come into contact with the outer edge of the wafer as described above, so that the wafer W is pushed into a position where the center position of the ring member 8 and the center position of the wafer W correspond with each other into alignment. Numeral 83c in FIG. 20 denotes a bearing.

The alignment of the wafer by moving the aligning members 82 after mounting the wafer W on the ring member 8 as described above permits the center positions of the wafer and the ring member 8 to correspond with each other at all times, thereby stably improving the uniformity of the film thickness of the coating film to provide an improved throughput.

This embodiment is applicable to, other than the case of delivering the wafer onto the ring member 8, a case of delivering the wafer onto the mount 41 and a case of delivering the wafer onto the support pins 41a of the mount 41. In any case, the wafer is mounted on the ring member 8 or the mount 41 while the center positions thereof aligned, so that the reduced-pressure drying processing with high uniformity can be performed. Further, this embodiment is also applicable to a reduced pressure drying unit having a configuration without provision of the current plate and the ring member. Further, a member on which the wafer is mounted belongs to "the mount" of the present invention. Therefore, the ring member and the like shall be included in the mount.

Figure 21:
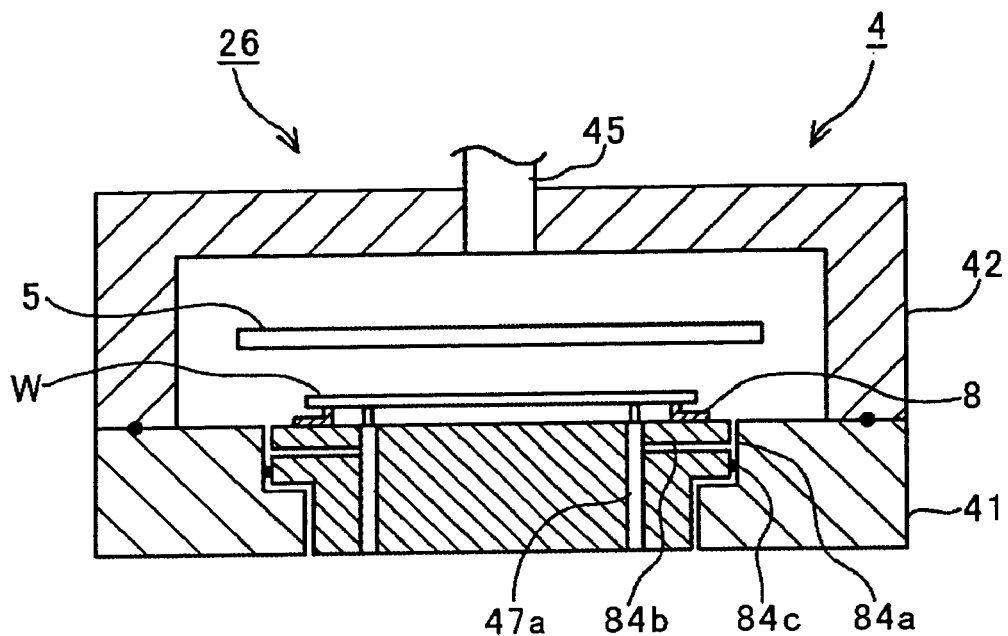
FIG. 21 is a cross-sectional view for explaining still another embodiment of the reduced-pressure drying unit according to the present invention.

FIG. 21 shows still another example of the reduced-pressure drying unit 26 of the present invention and this example is characterized by the mount on which the wafer W is mounted. In the mount 41 of this example, for example, a first ventilation passage 84a is formed to run through the mount 41 in the vertical direction, for example, immediately outside a region where the ring member 8 is provided, and a second ventilation passage 84b communicating with the through hole 47a of the lift pin 44 is formed starting from the first ventilation passage 84a. In the first ventilation passage 84a, an O-ring 84c is provided at a position closer to the external air than a position where the second ventilation passage 84b branches off therefrom in order to prevent the external air from entering the hermetic container 4 through the ventilation passages 84a and 84b.

In the case of no ventilation passages 84a and 84b being formed in the mount 41 here, a reduction in the pressure in the hermetic container 4 might cause the rear face of the wafer W to be sucked to the top face of the ring member 8 so that even if the inside of the container 4 is returned from the reduced pressure atmosphere to the atmospheric pressure, the center region of the rear face of the wafer W is sucked to the mount 41 because the rear face of the wafer W is still under the reduced pressure condition, resulting in a warped wafer. In the configuration where the mount 41 is provided with the ventilation passages 84a and 84b as described above, however, air easily leaks to the rear face side of the wafer W when the inside of the hermetic container 4 is returned from the reduced pressure atmosphere to the normal pressure atmosphere to provide the atmospheric pressure to the rear face side of the wafer W, so that suction between the center region of the rear face of the wafer W and the mount 41 is restrained to prevent warpage of the wafer.

This configuration is applicable to a reduced-pressure drying unit having a configuration without provision of the current plate and the ring member. This configuration can be applied because even the mount 41 having a configuration without provision of the ring member 8 as described above mounts the wafer W on the support pins 41a to form a space between the center region of the wafer W and the mount 41. Therefore, the ring member and the support pin shall be included in the supporting member of the present invention.

Figure 22:
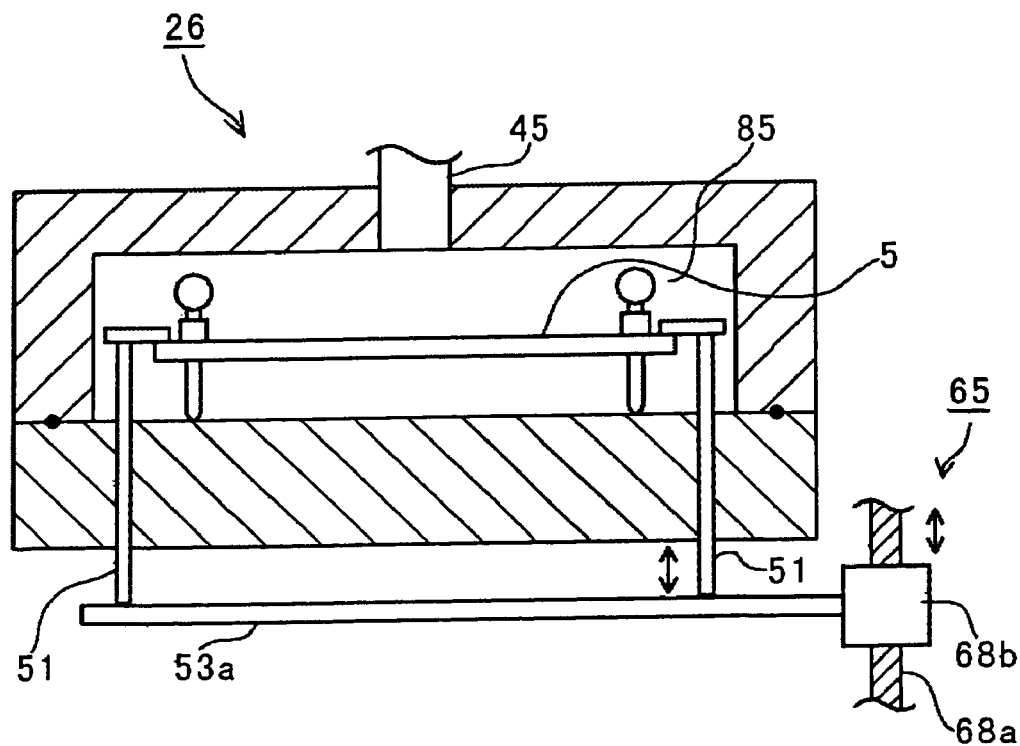
FIG. 22 is a cross-sectional view for explaining still another embodiment of the reduced-pressure drying unit according to the present invention.

FIG. 22 is still another example of the reduced-pressure drying unit 26 of the present invention in which the current plate 5 is provided to be parallel to the wafer W. More specifically, for example, a digimatic indicator 85 is provided on the mount 41, which constitutes a parallelism measuring means for measuring the parallelism of the current plate 5 as shown in FIG. 22. The raising and lowering mechanism 65 raises and lowers the current plate 5 through the raising and lowering plate 53a and the support rods 51 while receiving the detection value of the digimatic indicator 85, so that the current plate 5 is adjusted to be parallel to the wafer W. In this case, the current plate 5 can be accurately aligned to be parallel to the wafer W, thereby forming the coating film with more uniform film thickness.

Figure 23:
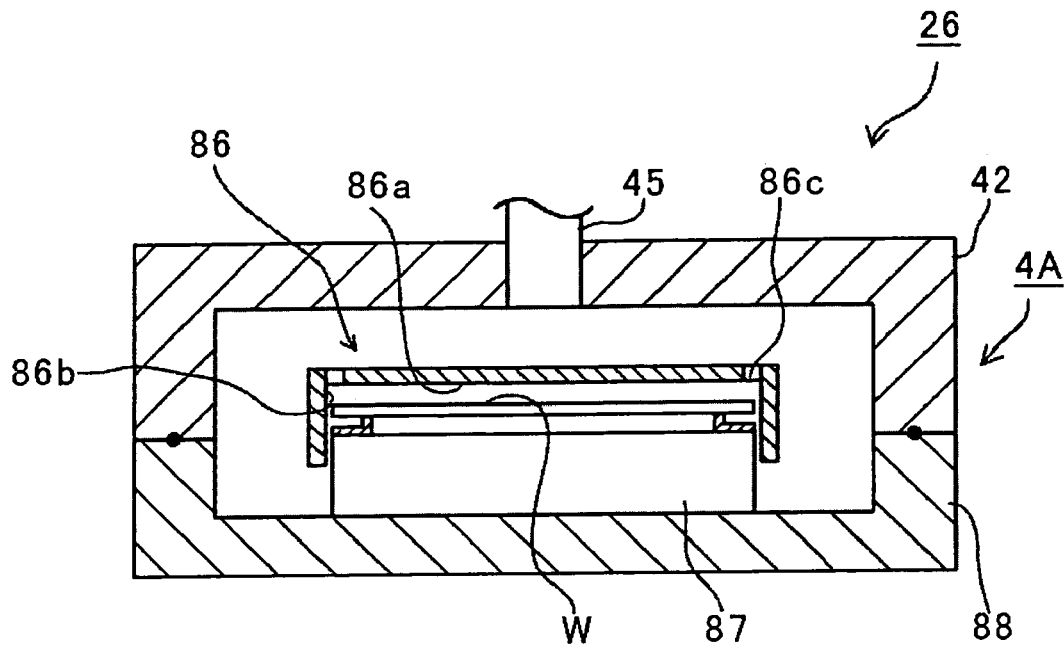
FIG. 23 is a cross-sectional view for explaining still another embodiment of the reduced-pressure drying unit according to the present invention.

Next, still another example of the reduced-pressure drying unit 26 of the present invention is explained with reference to FIG. 23. This example has a configuration that, in place of the current plate 5 in the shape of a plate, a current member 86 is provided which is formed in the shape of an inverted U to surround the front face and the outer edge of the wafer W. This current member 86 has a substantially horizontal plane 86a which is formed to face the front face of the wafer W and a substantially vertical plane 86b which extends downward substantially in the vertical direction from the horizontal plane 86a in a region in the outer vicinity of the wafer W to cover the outer edge of the wafer while forming a slight gap with the outer edge. The substantially horizontal plane 86a is formed with many ventilation holes 86c at regular intervals in the circumferential direction in a region in the vicinity of the outer periphery of the wafer. The gap between the side face of the wafer W and the substantially vertical plane 86b is set, for example, about 0.1 mm to create a large loss in pressure here.

In this example, for example, the diameter of a mount 87 for mounting a wafer thereon is set almost the same size as that of the wafer W, and the substantially vertical plane 86b extends to a position beside the mount 87 under the wafer W to cover the side face of the mount 87 through a slight gap. The gap between the side face of the wafer W and the side face of the mount 87 and the substantially vertical plane 86b is set, for example, about 0.1 mm to create a large loss in pressure here. In this example, a hermetic container 4A is constituted by the lid body 42 and a lower container 88, and the mount 87 is disposed inside the lower container 88.

In such a configuration, when the hermetic container 4A is made into a reduced-pressure atmosphere, the exhaust current in the container 4A is formed to detour the current member 86, so that solvent vapor vaporizing from the wafer W hits against the current member 86 to change in direction outward and flows along the inner side of the current member 86. Since just a slight gap is formed between the outer edge of the wafer and the side face of the mount 87 and the current member 86, a large loss in pressure is generated here. Therefore, the solvent vapor vaporizing from the wafer W flows from the ventilation holes 86c toward the exhaust pipe 45, thereby forming a stable air current which uniformly spreads in the radial direction. The solvent vapor uniformly spreads out in the radial direction as described above, thereby further improving the film thickness at the peripheral region of the coating film to further increase uniformity of the film thickness.

Figure 24:
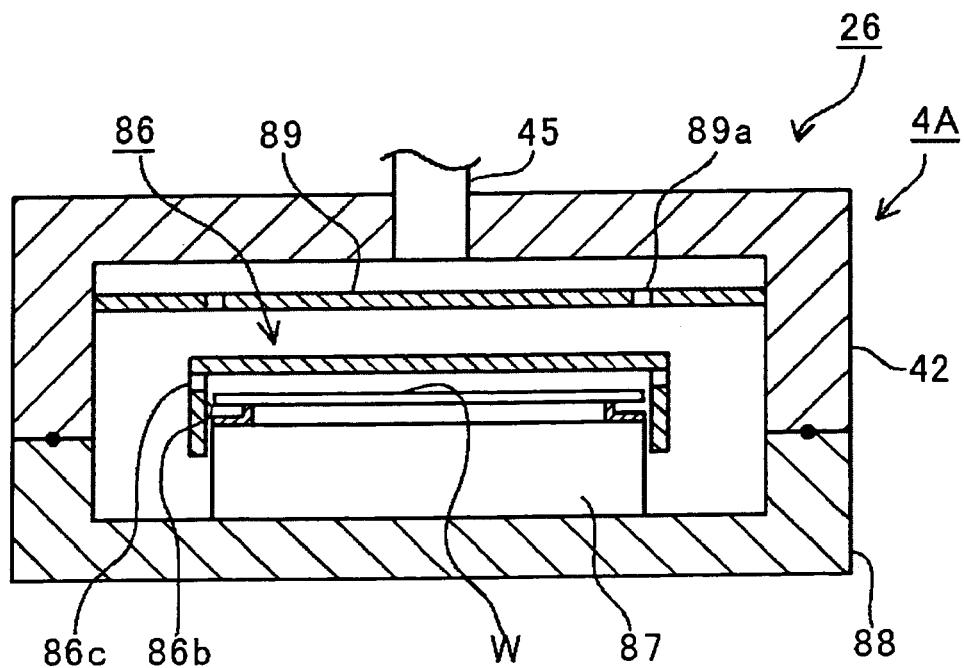
FIG. 24 is a cross-sectional view for explaining still another embodiment of the reduced-pressure drying unit according to the present invention.

In this event, as shown in FIG. 24, for example, a second current plate 89 may be provided above the current member 86 in the hermetic container 4A while facing the substantially horizontal plane 86a of the current member 86 to vertically divide the lid body 42, and ventilation holes 89a may be formed in the second current plate 89 at positions corresponding to the outer periphery and its vicinity of the wafer W. In the configuration in FIG. 24, the ventilation holes 86c of the current member 86 are formed in the substantially vertical plane 86b in the vicinity of the outer periphery of the wafer W.

In such a configuration, when the inside of the hermetic container 4A is made into a reduced pressure atmosphere, the solvent vapor vaporizing from the wafer W flows out from the ventilation holes 86c toward the exhaust pipe 45 and through the ventilation holes 89a formed in the second current plate 89 toward the exhaust pipe 45. Such a double structure of the current member 86 and the second current plate 89 enables the formation of a stable air current which uniformly spreads out in the radial direction of the wafer W. Thereby, the solvent vapor more uniformly spreads out in the radial direction so that the film thickness of the coating film can be further improved at the peripheral region of the coating film to further increase the uniformity of the film thickness.

It should be noted that the current member 86 and the second current plate 89 are also applicable to the case in which the wafer is mounted on the mount 41 having the configuration in FIG. 6, and in this case, the substantially vertical plane 86b is constituted to extend to a position covering the side of the wafer W through a slight gap, thereby improving the film thickness at the peripheral region of the coating film formed on the front face of the wafer W.

Figure 25:
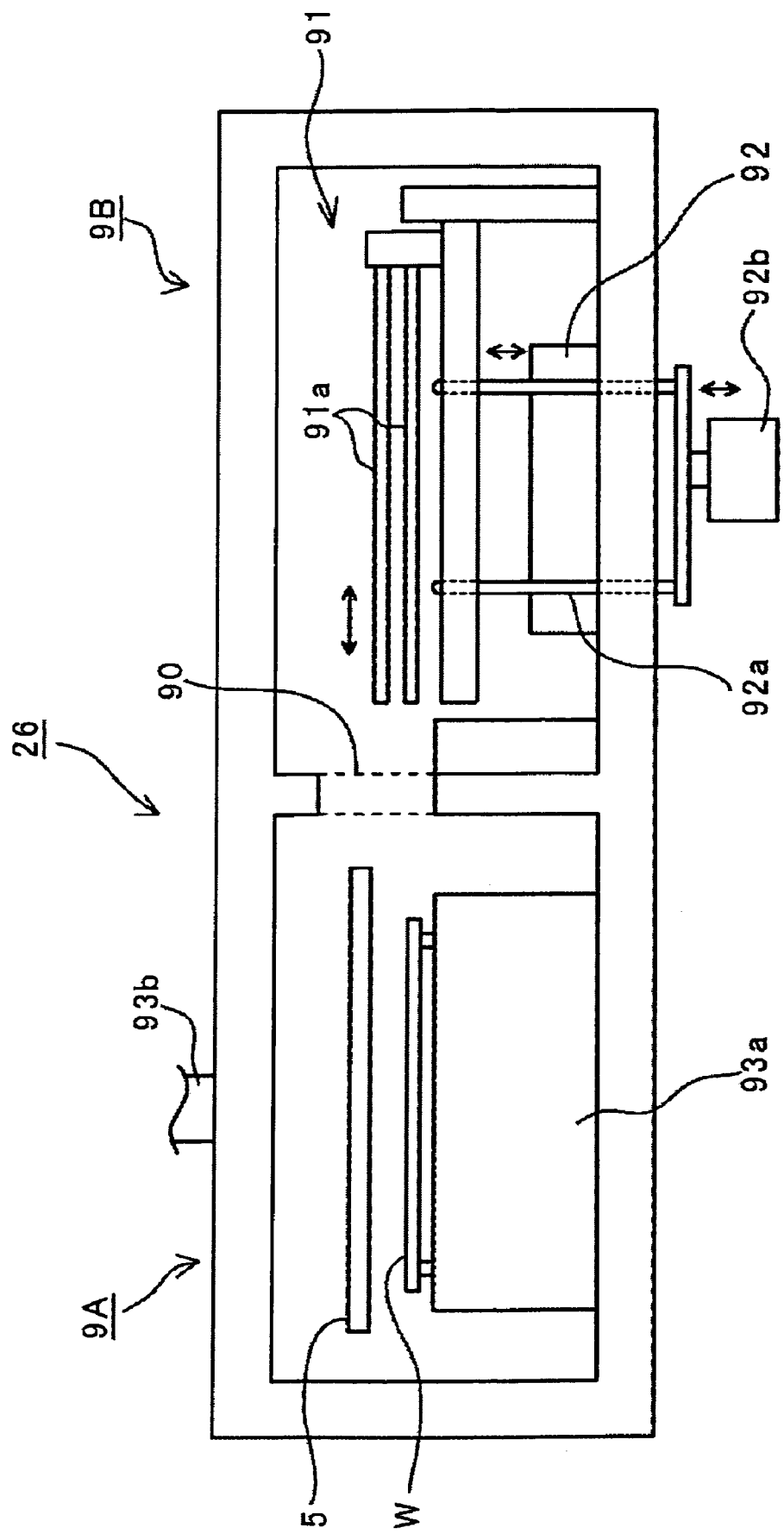
FIG. 25 is a cross-sectional view for explaining still another embodiment of the reduced-pressure drying unit according to the present invention.

Further, the reduced-pressure drying unit 26 may be configured as shown in FIG. 25. This embodiment is constituted such that, adjacent to a hermetic container 9A in which the reduced-pressure drying processing is performed, a transfer chamber 9B is provided which includes a subsidiary carrier 91 dedicated to carry the wafer W to the hermetic container 9A, and that a gate valve 90 opens and closes between the hermetic container 9A and the transfer chamber 9B.

Figure 26:
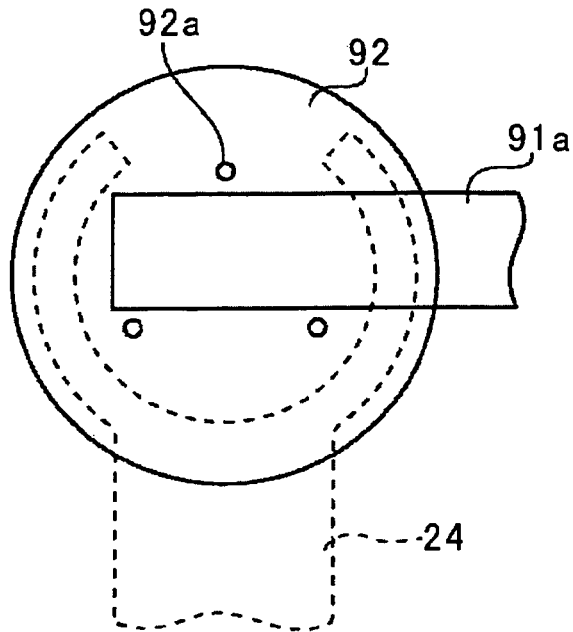
FIG. 26 is a plane view for explaining still another embodiment.

The subsidiary carrier 91 delivers and receives the wafer W to/from the already-described main carrier 24, in which, for example, as shown in FIG. 25, two arms 91a are configured to freely approach and retract to/from the hermetic container 9A and to be ascendable and descendable separately. Further, the transfer chamber 9B is provided with a delivery table 92 including delivery pins 92a which are ascendable and descendable by a raising and lowering mechanism 92b for delivering and receiving the wafer between the subsidiary carrier 91 and the main carrier 24. This delivery table 92 is configured such that, for example, as shown in FIG. 26, the arm 91a of the subsidiary carrier 91 and the arm of the main carrier 24 can access each other in such a manner not to interfere with the delivery pins 92a, so that the wafer can be delivered and received between them. Numeral 93a in FIG. 26 denotes a mount of the wafer W and numeral 93b denotes an exhaust pipe.

In such a configuration, the wafer W is carried in the transfer chamber 9B by the main carrier 24 through a not shown wafer transfer port of the transfer chamber 9B with the gate valve 90 closed, and the wafer W is delivered to the subsidiary carrier 91 via the delivery pins 92a. After the main carrier 24 is allowed to retract out, the transfer port is closed, and thereafter the gate valve 90 is opened to allow the subsidiary carrier 91 to carry the wafer W into the hermetic container 9A.

In this embodiment, the wafer W is first carried to the transfer chamber 9B, then the transfer chamber 9B is closed, and the gate valve 90 is opened to carry the wafer W into the hermetic container 9A, thereby preventing the external air from entering the container 9A when the wafer W is carried into the hermetic container 9A.

Figure 27:
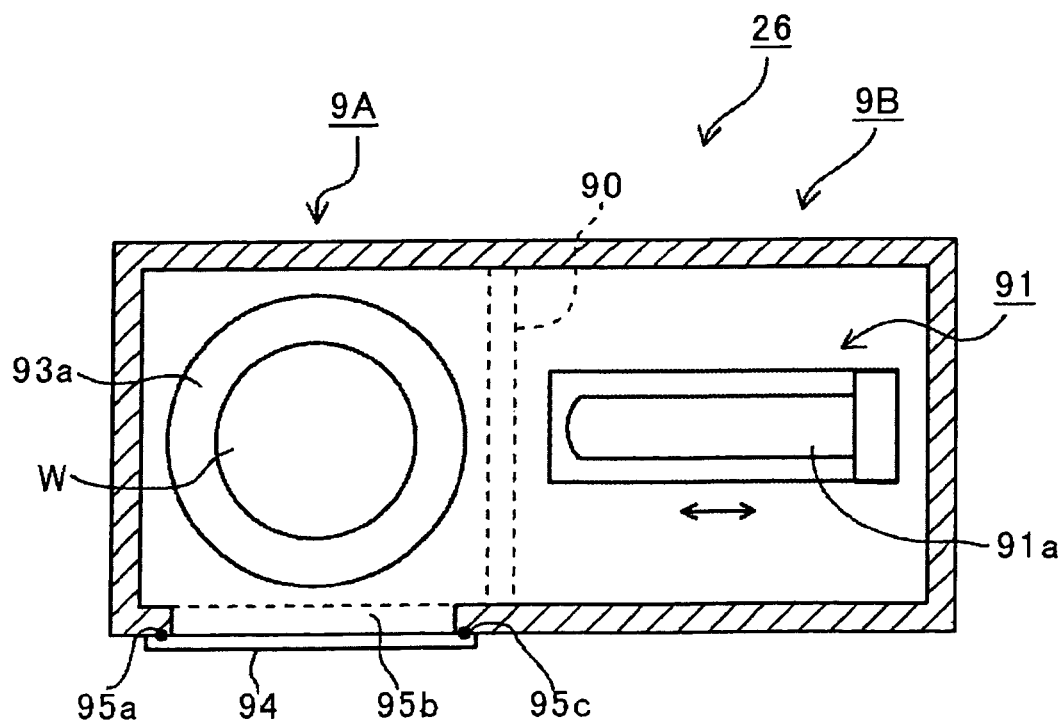
FIG. 27 is a cross-sectional view for explaining still another embodiment of the reduced-pressure drying unit according to the present invention.

Further, in the reduced-pressure drying unit 26, for example, as shown in FIG. 27, a part of the side wall of the hermetic container 9A may be constituted by a transparent element 94 made of, for example, transparent vinyl chloride. For example, the transparent element 94 is attached to a side wall 95a through an O-ring 95c to close an opening 95b which is formed in the side wall 95a of the hermetic container 9A. This arrangement has an advantage that the reduced-pressure drying processing performed in the hermetic container 9A can be confirmed by a visual check.

The reduced-pressure drying unit 26 is installed, for example, in the shelf units U2 and U3, in which case, the carriage of the wafer W into the reduced-pressure drying unit 26 and the carriage of the wafer W from the reduced-pressure drying unit 26 are performed by the delivery arm 23, the main carrier 24, and the carrier arm 27 in predetermined processes.

Figure 28:
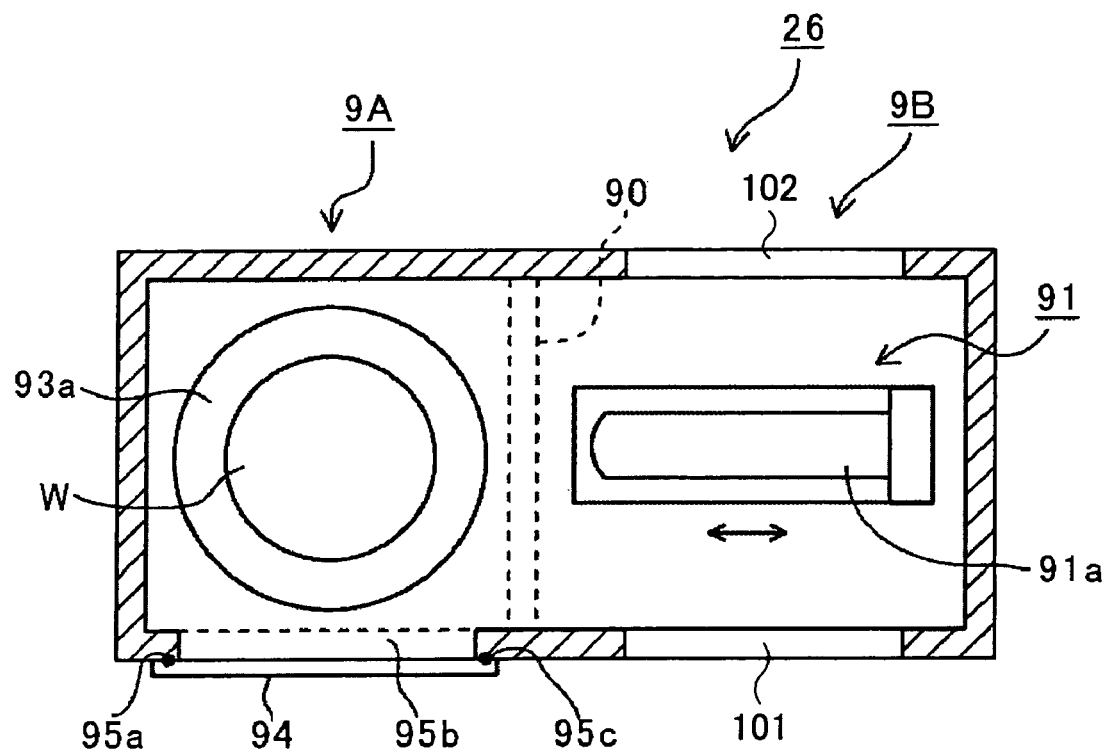
FIG. 28 is a cross-sectional view showing another example of the reduced-pressure drying unit.

In consideration of convenience for these carrier devices to access the inside of the reduced-pressure drying unit 26 in the above case, for example, a reduced-pressure drying unit 26 shown in FIG. 28 can be proposed. Specifically, in the reduced-pressure drying unit 26 shown in FIG. 28, openings 101 and 102 are provided on respective sides of the transfer chamber 9B. Therefore, the above-described carrier devices can carry the wafer W into/out of the reduced-pressure drying unit 26 through the openings 101 and 102.

Figure 29:
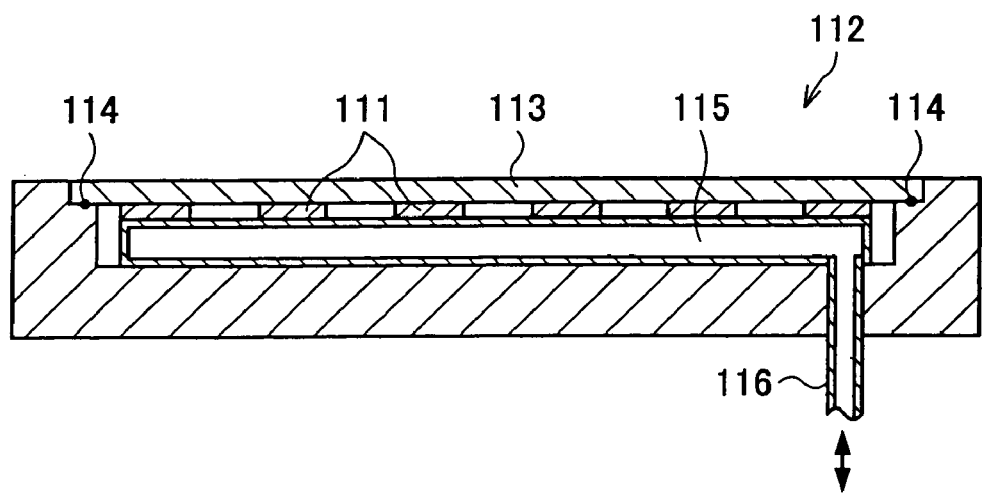
FIG. 29 is a cross-sectional view showing an example of a configuration of the inside of another mount.
Figure 30:
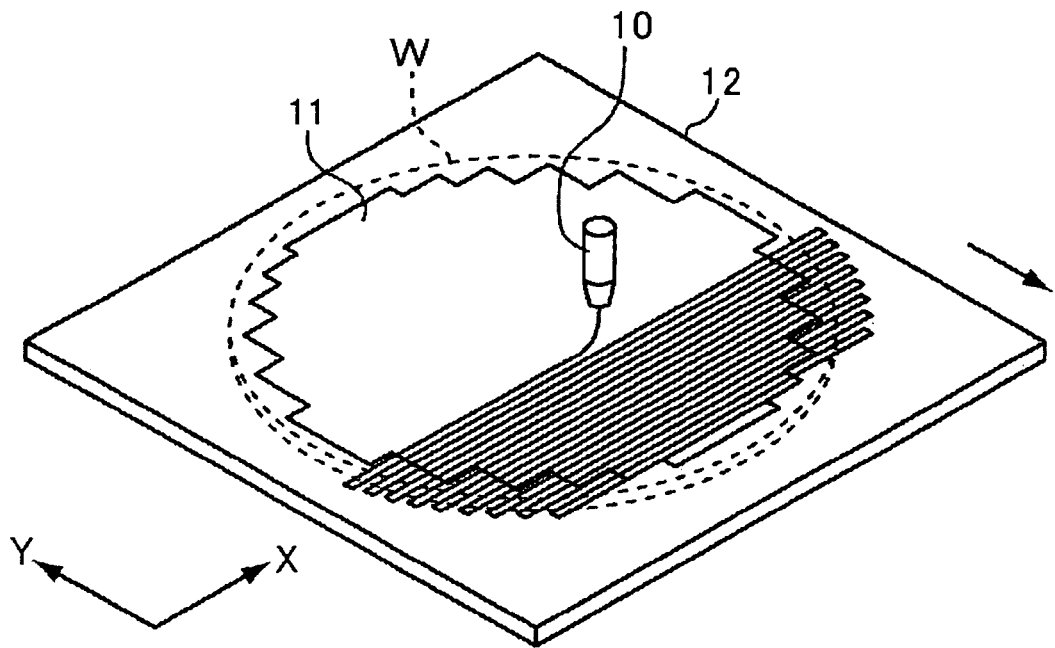
FIG. 30 is a perspective view for explaining a method of coating a resist solution.
Figure 31:
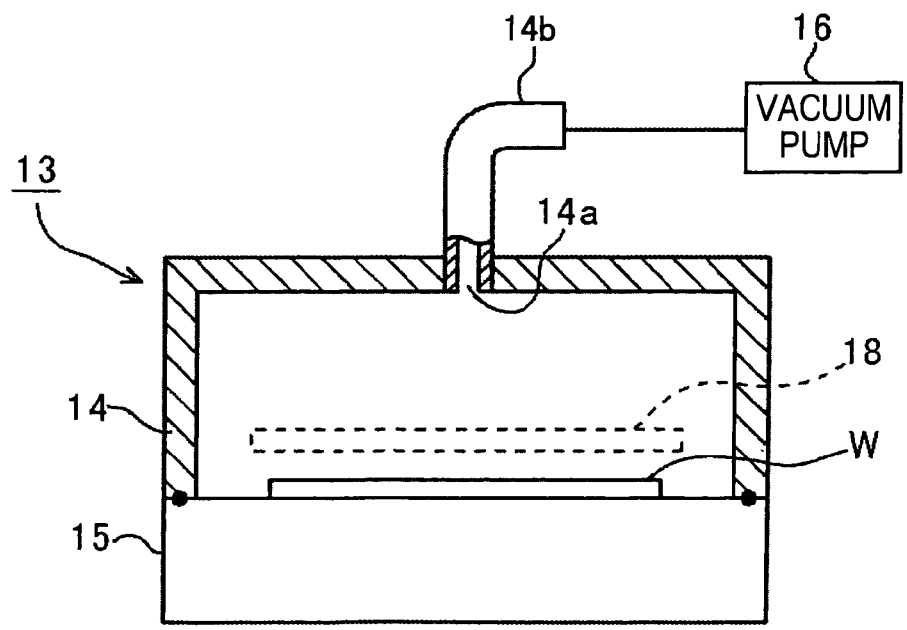
FIG. 31 is a cross-sectional view for explaining a conventional reduced-pressure drying unit.
Figure 32:
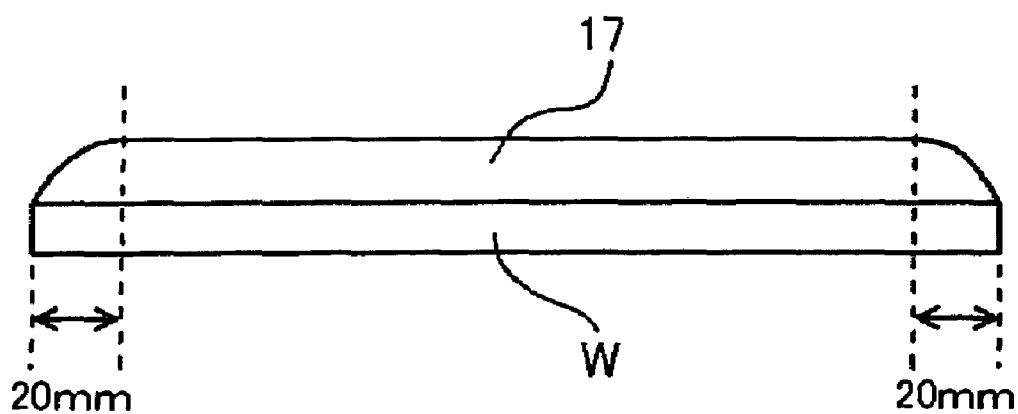
FIG. 32 is a cross-sectional view showing a state of a coating film after the performance of reduced-pressure drying processing in the conventional reduced-pressure drying unit.
Figure 33:
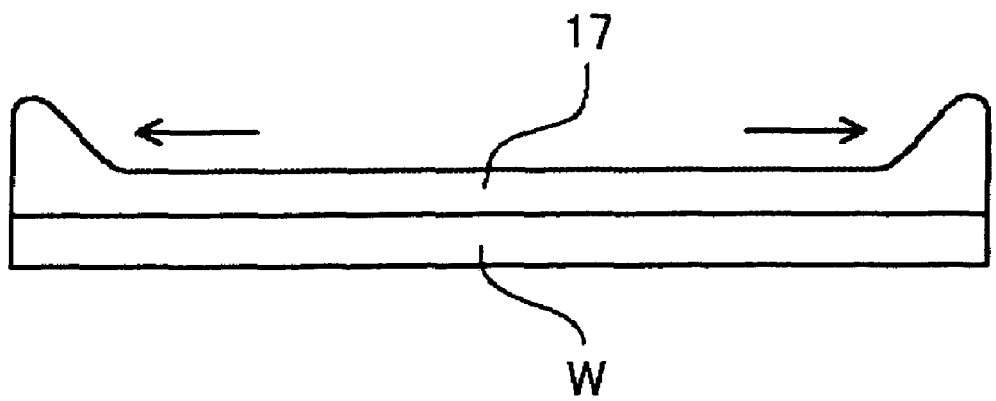
FIG. 33 is a cross-sectional view showing another state of a coating film after the performance of the reduced-pressure drying processing in the conventional reduced-pressure drying unit.

It should be noted that while the above-described mount 41 has a configuration including the heater H therein, it is also adoptable to use a mount 112, as shown in FIG. 29, having a temperature regulator, for example, Peltier elements 111.

The mount 112 has a face plate 113 on the front face where a substrate such as a wafer or the like is directly mounted. The face plate 113 is attached to the body of the mount 112 through a sealing material 114 such as an O-ring in consideration of air tightness. Under the lower face of the face plate 113, the Peltier elements 111 are arranged annularly and concentrically. Under the Peltier elements 111, a cooling flow passage 115 is provided for cooling the lower face side of the Peltier elements 111. Through the cooling flow passage 115, for example, a cooling fluid such as cooling water or the like flows. The cooling fluid circulates between a cooling fluid supply source (not shown) and the cooling flow passage 115 through a flow passage 116.

According to the mount 112 having the above-described configuration, the substrate such as a wafer or the like mounted on the face plate 113 can be regulated in temperature within a range, for example, from 10° C. to 40° C. Therefore, the use of this mount 112 makes it possible to keep the temperature of the wafer at a low temperature, for example, at about 15° C. at the beginning during the reduced-pressure drying to prevent the solvent from vaporizing from the coating solution such as a resist solution or the like on the wafer, and thereafter to keep the temperature of the wafer at room temperature, for example, at 23° C. when drying the wafer, for example, with the current plate made closer to the wafer to control the liquid flow of the coating solution, so that the drying processing can appropriately be performed.

The substrate used in the present invention in the above explanation may be an LCD substrate or a reticle substrate for a photomask. Further, the coating solution is not limited to the resist solution, but may be an interlayer insulating material, a low dielectric material, a ferroelectric material, a wiring material, an organic metal material, a metal paste, or the like. Further, the present invention is applicable to an application of the coating solution by a spin coating method, and also to an application of the coating solution by supplying the coating solution onto the front face of the substrate in a spiral form.

As described above, according to the present invention, a reduced-pressure drying processing can be performed keeping a high uniformity of film thickness of a coating film in a reduced-pressure drying unit for a substrate used in forming a coating film.

What is claimed is:

1. A method for forming a coating film on a substrate, comprising:

applying to a front face of the substrate a coating solution made by mixing a component of a coating film, a solvent and water;

mounting the substrate coated with the coating solution in a hermetic container;

bringing the inside of the hermetic container into a reduced-pressure atmosphere to exhaust air therein at a predetermined rate to reduce air pressure in the container until a point of pressure at which the solvent in the coating solution starts vaporizing;

subsequently gradually reducing the pressure in the container at a rate lower than the predetermined rate until a point of pressure at which the water contained in the coating solution starts vaporizing;

providing a current member so that the current member faces the substrate at a first position above the substrate mounted in the hermetic container, until the pressure in the container reaches a pressure set in between the point of pressure at which the solvent in the coating solution starts vaporizing and the point of pressure at which the water contained in the coating solution starts vaporizing; and changing the current member so that the current member faces the substrate at a second position higher than the first position, when the pressure becomes lower than the set pressure.

* * * * *